US009328416B2

(12) United States Patent
Dhas et al.

(10) Patent No.: US 9,328,416 B2
(45) Date of Patent: May 3, 2016

(54) METHOD FOR THE REDUCTION OF DEFECTIVITY IN VAPOR DEPOSITED FILMS

(71) Applicant: Lam Research Corporation, Fremont, CA (US)

(72) Inventors: Arul N. Dhas, Sherwood, OR (US); Akhil Singhal, Beaverton, OR (US); Ming Li, West Linn, OR (US); Kareem Boumatar, Vancouver, WA (US)

(73) Assignee: Lam Research Corporation, Fremont, CA (US)

( * ) Notice: Subject to any disclaimer, the term of this patent is extended or adjusted under 35 U.S.C. 154(b) by 153 days.

(21) Appl. No.: 14/158,536

(22) Filed: Jan. 17, 2014

(65) Prior Publication Data
US 2015/0203967 A1    Jul. 23, 2015

(51) Int. Cl.
*C23C 16/40* (2006.01)
*C23C 16/44* (2006.01)
*C23C 16/455* (2006.01)

(52) U.S. Cl.
CPC ........... *C23C 16/401* (2013.01); *C23C 16/4404* (2013.01); *C23C 16/45542* (2013.01)

(58) Field of Classification Search
CPC .... C23C 16/40; C23C 16/401; C23C 16/402; C23C 16/50
See application file for complete search history.

(56) References Cited

U.S. PATENT DOCUMENTS

| | | | |
|---|---|---|---|
| 4,872,947 A | 10/1989 | Wang et al. | |
| 4,892,753 A | 1/1990 | Wang et al. | |
| 5,166,101 A | 11/1992 | Lee et al. | |
| 5,354,715 A | 10/1994 | Wang et al. | |
| 5,426,076 A | 6/1995 | Moghadam | |
| 5,518,959 A | 5/1996 | Jang et al. | |
| 5,605,859 A * | 2/1997 | Lee | 438/384 |
| 5,654,475 A * | 8/1997 | Vassiliou et al. | 562/413 |
| 5,674,783 A | 10/1997 | Jang et al. | |
| 5,970,383 A | 10/1999 | Lee | |
| 6,071,573 A | 6/2000 | Koemtzopoulos et al. | |
| 6,121,164 A | 9/2000 | Yieh et al. | |
| 6,416,577 B1 | 7/2002 | Suntoloa et al. | |
| 6,530,380 B1 | 3/2003 | Zhou et al. | |

(Continued)

OTHER PUBLICATIONS

Juarez, H., et al., "Low temperature deposition: properties of SiO2 films from TEOS and ozone by APCVD system". XIX Latin American Symposium on Solid State Physics (SLAFES XIX). Journal of Physics: Conference Series 167 (2009) 012020, pp. 1-6.*

(Continued)

*Primary Examiner* — Bret Chen
(74) *Attorney, Agent, or Firm* — Weaver Austin Villeneuve & Sampson LLP

(57) ABSTRACT

Methods for depositing film on substrates are described. In various cases, a high thermal conductivity gas such as helium is used to deposit a conditioning layer on surfaces of the reaction chamber before it is used to process substrates. The helium may be used to help atomize/vaporize a liquid reactant in a heated injection module before the reactant is delivered to the reaction chamber. In some embodiments, a purge gas including helium is used during a post-deposition purge during deposition on substrates. The disclosed embodiments allow for mixed recipe processing without having to clean the reaction chamber between recipes, and without forming a high number of particles/defects on the substrates. This allows for an improved throughput of high quality film, even where mixed recipes are used in a single reaction chamber.

22 Claims, 14 Drawing Sheets

(56) References Cited

U.S. PATENT DOCUMENTS

| | | | |
|---|---|---|---|
| 6,819,969 B2 | 11/2004 | Lee et al. | |
| 7,087,497 B2 | 8/2006 | Yuan et al. | |
| 7,204,913 B1 | 4/2007 | Singh et al. | |
| 7,241,690 B2 | 7/2007 | Pavone et al. | |
| 7,601,639 B2 | 10/2009 | Pavone et al. | |
| 7,704,894 B1 | 4/2010 | Henri et al. | |
| 7,923,376 B1 | 4/2011 | Dhas et al. | |
| 8,017,527 B1 | 9/2011 | Dhas et al. | |
| 8,034,725 B1 | 10/2011 | Henri et al. | |
| 8,101,531 B1 | 1/2012 | Li et al. | |
| 8,163,087 B2 | 4/2012 | Faguet et al. | |
| 2002/0073922 A1* | 6/2002 | Frankel et al. | 118/715 |
| 2003/0194493 A1 | 10/2003 | Chang et al. | |
| 2004/0134427 A1 | 7/2004 | Derderian et al. | |
| 2005/0196929 A1 | 9/2005 | Yuan et al. | |
| 2005/0221020 A1* | 10/2005 | Fukiage | 427/569 |
| 2008/0302281 A1* | 12/2008 | Bernard et al. | 110/192 |
| 2009/0278116 A1 | 11/2009 | Yamate | |
| 2009/0311857 A1 | 12/2009 | Todd et al. | |
| 2009/0325391 A1* | 12/2009 | De Vusser et al. | 438/787 |
| 2011/0151142 A1* | 6/2011 | Seamons et al. | 427/579 |
| 2011/0256726 A1 | 10/2011 | LaVoie et al. | |
| 2012/0097330 A1* | 4/2012 | Iyengar et al. | 156/345.34 |
| 2015/0147482 A1 | 5/2015 | Kang et al. | |

OTHER PUBLICATIONS

US Office Action, dated Dec. 14, 2007, issued in U.S. Appl. No. 11/396,303.
US Final Office Action, dated Aug. 6, 2008, issued in U.S. Appl. No. 11/396,303.
US Office Action, dated Mar. 19, 2009, issued in U.S. Appl. No. 11/396,303.
US Final Office Action, dated Oct. 28, 2009, issued in U.S. Appl. No. 11/396,303.
US Office Action, dated Jan. 29, 2010, issued in U.S. Appl. No. 11/396,303.
US Office Action, dated Jul. 16, 2010, issued in U.S. Appl. No. 11/396,303.
US Notice of Allowance, dated Dec. 8, 2010, issued in U.S. Appl. No. 11/396,303.
US Office Action, dated Feb. 15, 2008, issued in U.S. Appl. No. 11/602,564.
US Final Office Action, dated Sep. 4, 2008, issued in U.S. Appl. No. 11/602,564.
US Office Action, dated Mar. 20, 2009, issued in U.S. Appl. No. 11/602,564.
US Notice of Allowance, dated Dec. 14, 2009, issued in U.S. Appl. No. 11/602,564.
US Notice of Allowaility and Examincer's Amendment Communication, dated Feb. 17, 2010, issued in U.S. Appl. No. 11/602,564.
US Office Action, dated Dec. 7, 2010, issued in U.S. Appl. No. 12/723,504.
US Notice of Allowance, dated Jun. 27, 2011, issued in U.S. Appl. No. 12/723,504.
U.S. Appl. No. 14/089,653, filed Nov. 25, 2013, entitled "Chamber undercoat preparation method for low temperature ALD films."
U.S. Appl. No. 14/712,167, filed May 14, 2015, entitled "Minimizing radical recombination using ALD silicon oxide surface coating with intermittent restoration plasma,".
U.S. Appl. No. 14/683,022, filed Apr. 9, 2015 entitled "Eliminating first wafer metal contamination effect in high density plasma chemical vapor deposition systems."
Kim et al. (1991) "Recombination of O, N, and H Atoms on Silica: Kinetics and Mechanism," *Langmuir*, 7(12):2999-3005.
Knoops et al.(2010) "Conformality of Plasma-Assisted ALD: Physical Processes and Modeling," *Journal of The Electrochemical Society*, 157(12):G241-G249.

* cited by examiner

|   |   | Baseline | Scheme 2 | Scheme 3 |
|---|---|---|---|---|
| 1 | Helium flow during chamber conditioning process? | no | yes | yes |
| 2 | Purge Time (s) / Loadlock Time (s) | 2/4 | 2/4 | 4/2 |
| 3 | Flow of O2 during Post-Deposition Purge (sccm) | 8000 | 8000 | 4000 |
| 4 | Flow of He during Post-Deposition Purge (sccm) | 0 | 0 | 4000 |
| 5 | Flow of O2 during Loadlock Time (sccm) | 5000 | 5000 | 5000 |
| 6 | Single wafer 100LD 0.04 μm median adders at high accumulation (~10 μm) | 34 | 22 | 10 |

FIG. 10

| | | Defects @ 0.04 μm | | Defects @ 0.08 μm | |
|---|---|---|---|---|---|
| | | Process A | Process B | Process A | Process B |
| Baseline Scheme | Maximum Value | 72 | 41 | 15 | 15 |
| | Median Value | 13 | 12 | 2 | 3 |
| Scheme 3 | Maximum Value | 17 | 15 | 4 | 6 |
| | Median Value | 8 | 3 | 1 | 1 |

Baseline

Scheme 3

| Film Properties | | Thickness (A) | | NU% (1s) | |
|---|---|---|---|---|---|
| | | Process A | Process B | Process A | Process B |
| BSL Process | Max value | 109 | 158 | 1.56 | 1.42 |
| | Min value | 100 | 149 | 1.19 | 0.94 |
| | Range | 9 | 9 | 0.4 | 0.5 |
| | Median | 103 | 152 | 1.31 | 1.05 |
| OPT_2 Process | Max value | 105 | 155 | 1.50 | 1.22 |
| | Min value | 100 | 148 | 1.14 | 1.03 |
| | Range | 5 | 7 | 0.4 | 0.2 |
| | Median | 103 | 152 | 1.33 | 1.17 |

METHOD FOR THE REDUCTION OF DEFECTIVITY IN VAPOR DEPOSITED FILMS

BACKGROUND

As the semiconductor industry advances, device dimensions are becoming increasingly smaller. These progressively smaller features require deposition procedures that are extremely uniform, as the presence of film impurities or other non-uniformities can often lead to the failure of a semiconductor device. An undercoat can help improve wafer-to-wafer thickness uniformity and within-wafer thickness uniformity.

SUMMARY

Certain aspects of the disclosed embodiments relate to methods and apparatus for preparing a reaction chamber and depositing material on substrates. The reaction chamber may be prepared by depositing a conditioning layer such as an undercoat and/or pre-deposition coat. The conditioning layer helps protect the underlying reaction chamber surfaces, and minimizes the formation of defect-causing particles that can fall onto substrates as they are processed in the reaction chamber. The conditioning layer may also promote uniform deposition results on substrates by priming the reaction chamber and balancing chamber impedance, for example.

In one aspect of the disclosed embodiments, a method for preparing a reaction chamber for depositing film on substrates is provided, including: flowing a liquid reagent into a heated injection module; atomizing the liquid reagent in the heated injection module in the presence of helium to create a source gas including the atomized liquid reagent and helium; flowing the source gas from the heated injection module into the reaction chamber; and exposing the reaction chamber to plasma to deposit a film from the source gas on surfaces of the reaction chamber while no substrate is present in the reaction chamber.

The liquid reagent may be TEOS in some cases. The TEOS may flow at a rate less than about 10 mL/min into the heated injection module. The source gas may further include a co-reactant. In one example, the co-reactant includes oxygen. The source gas may include between about 40-80% helium in some implementations.

In some cases, flowing the source gas into the reaction chamber and exposing the reaction chamber to plasma are performed at least partially concurrently to thereby deposit the film through a chemical vapor deposition gas-phase reaction. In other cases, flowing the source gas into the reaction chamber and exposing the reaction chamber to plasma are performed cyclically to deposit the film through an atomic layer deposition surface reaction. The plasma may be exposed to the reaction chamber for a duration between about 30-90 seconds to form an undercoating film in certain embodiments. The method may be repeated to form a pre-deposition coat film on the undercoat film, where during formation of the pre-deposition coat film, the reaction chamber is exposed to plasma for a duration between about 60-350 seconds, and where a deposition rate on surfaces of the reaction chamber is higher during formation of the undercoat film than during formation of the pre-deposition coat film. In some cases, the conditioning layer may be a pre-deposition coat with or without an undercoat underneath. Exposing the reaction chamber to plasma may occur over a duration between about 60-350 seconds to form a pre-deposition coat film having a thickness between about 1-1.5 µm.

In another aspect of the disclosed embodiments, a method for depositing film on a substrate is provided, including: flowing a first source gas including a first reagent and helium into a reaction chamber and exposing the reaction chamber to a first plasma to deposit a first film on surfaces of the reaction chamber while no substrate is present in the reaction chamber, where the first reagent is liquid at room temperature; providing a substrate to the reaction chamber; and flowing a second source gas into the reaction chamber and exposing the reaction chamber to a second plasma to thereby deposit a second film on the substrate, where the second source gas includes a second reagent that is liquid at room temperature, and where the second source gas is substantially free of helium.

The first reagent may include TEOS, for example. The flow rate of TEOS in the first source gas flowed into the reaction chamber may be less than about 10 mL/min, as measured when the TEOs is in liquid form at room temperature. The method may also include purging the reaction chamber for at least about 3 seconds with a purge gas including helium after the second film, or a portion thereof, is formed on the substrate. The flow rate of helium in the purge gas may be between about 10-20 SLM.

As mentioned, in some cases the conditioning layer deposited on surfaces of the reaction chamber may include an undercoat and a pre-deposition coat. As such, the method may further include before providing a substrate to the reaction chamber, flowing a third source gas including a third reagent and helium into the reaction chamber and exposing the reaction chamber to a third plasma to thereby deposit a third film on surfaces of the reaction chamber while no substrate is present in the reaction chamber, where the third reagent is liquid at room temperature, where the first plasma is exposed to the reaction chamber for a duration between about 30-90 seconds, where the third plasma is exposed to the reaction chamber for a duration between about 60-350 seconds, and where a deposition rate is higher during deposition of the first film than during deposition of the third film. In this case, the first film may be an undercoat, the third film may be a pre-deposition coat, and the second film may be a layer of material deposited on substrates.

In a number of cases, more than one recipe may be used to deposit material on substrates within a single reaction chamber. Each time a recipe is changed, the reaction chamber may undergo a new conditioning process to deposit a secondary conditioning layer on chamber surfaces. The secondary conditioning layer may be deposited directly on film deposited on chamber surfaces during the previous round of deposition on substrates. Where this is the case, the method may further include after depositing the second film on the substrate, removing the substrate from the reaction chamber; flowing a fourth source gas into the reaction chamber and exposing the reaction chamber to a fourth plasma to thereby deposit a fourth film on surfaces of the reaction chamber, where the fourth source gas includes helium; receiving a second substrate in the reaction chamber; and flowing a fifth source gas into the reaction chamber and exposing the reaction chamber to a fifth plasma to thereby deposit a fifth film on the second substrate, where at least one reaction parameter is different between depositing the second film on the substrate and depositing the fifth film on the second substrate, where the reaction parameter is selected from the group consisting of: a power used to generate plasma, a frequency used to generate plasma, plasma exposure time, reactants delivered to the reaction chamber, timing of delivery of reactants to the reaction chamber, flow rate of delivery of reactants to the reaction chamber, pressure, electrode gap and temperature. In this case, the fourth film on the reaction chamber surfaces may be a secondary pre-deposition coat.

The fourth film may be deposited on surfaces of the reaction chamber without first cleaning the surfaces of the reaction chamber after the second film is deposited on the substrate. The second film deposited on the substrate and the fifth film deposited on the second substrate may each have fewer than about 10 particles of about 0.04 µm or larger detectable thereon. The fifth film may be deposited on a substrate immediately after the fourth film is formed on surfaces of the reaction chamber, without any intervening deposition operations in the reaction chamber, and the fifth film may have fewer than about 20 particles of about 0.04 µm or larger detectable thereon. The first film may have a thickness between about 1-1.5 µm.

In another aspect of the disclosed embodiments, an apparatus for depositing film on substrates is provided. The apparatus may include a reaction chamber having one or more inlets for delivering gas phase reactants, a heated injection module coupled with the inlet for vaporizing and/or atomizing liquid phase reactants, an outlet for removing materials from the reaction chamber, a plasma generation source for exposing the reaction chamber to plasma, and a controller configured to perform any of the methods disclosed herein.

In one embodiment, the controller is configured to flow a liquid reagent into the heated injection module; atomize the liquid reagent in the heated injection module in the presence of helium to create a source gas including the atomized liquid reagent and helium; flow the source gas from the heated injection module into the reaction chamber; and expose the reaction chamber to plasma to deposit a film from the source gas on surfaces of the reaction chamber while no substrate is present in the reaction chamber. The controller may be configured to flow a source gas that includes between about 40-80% helium, by volume. The controller may be configured to flow a co-reactant such as oxygen into the reaction chamber. In some embodiments, the controller is configured to flow the source gas into the reaction chamber and expose the reaction chamber to plasma at least partially concurrently to thereby deposit the film through a chemical vapor deposition gas-phase reaction. In other embodiments, the controller is configured to flow the source gas into the reaction chamber and expose the reaction chamber to plasma in a cyclic manner to thereby deposit the film through an atomic layer deposition surface reaction. The controller may be configured to expose the reaction chamber to plasma for a duration between about 30-90 seconds to form an undercoating film. The controller may be configured to repeat the method to form a pre-deposition coat film on the undercoat film, where the controller is configured to expose the reaction chamber to plasma for a duration between about 60-350 seconds during deposition of the pre-deposition coat film. The controller may be configured to achieve a higher deposition rate during formation of the undercoat film than during formation of the pre-deposition coat film.

In another aspect of the disclosed embodiments, the controller may be configured to deposit a conditioning layer on reaction chamber surfaces and then deposit film on substrates in the conditioned reaction chamber. In one example, the controller may be configured to flow a first source gas including a first reagent and helium into the reaction chamber and expose the reaction chamber to a first plasma to thereby deposit a first film on surfaces of the reaction chamber while no substrate is present in the reaction chamber, where the first reagent is liquid at room temperature; provide a substrate to the reaction chamber; and flow a second source gas into the reaction chamber and expose the reaction chamber to a second plasma to thereby deposit a second film on the substrate, where the second source gas includes a second reagent that is liquid at room temperature, and where the second source gas is substantially free of helium.

The controller may have instructions to flow the first reagent at a rate less than about 10 mL/min, as measured when the first reagent is liquid at room temperature. The first reagent may be TEOS. The controller may also be configured to purge the reaction chamber for at least about 3 seconds with a purge gas that includes helium. The purge may be conducted after the second film, or a portion thereof, is deposited on the substrate. The controller may be configured to flow the helium in the purge gas at a flow rate between about 10-20 SLM. The second reagent may also include TEOS. In some cases, the controller may be configured to flow a third source gas including a third reagent and helium into the reaction chamber and expose the reaction chamber to a third plasma to thereby deposit a third film on surfaces of the reaction chamber before providing the substrate to the reaction chamber, where the third reagent is liquid at room temperature. The controller may be configured to expose the reaction chamber to the first plasma for a duration between about 30-90 seconds, and to expose the reaction chamber to the third plasma for a duration between about 60-350 seconds. The controller may also be configured to deposit the third film at a higher deposition rate than the first film.

The controller may be further configured to deposit film on substrates according to two or more recipes. Where this is the case, the controller may be configured to remove the substrate from the reaction chamber after depositing the second film on the substrate; flow a fourth source gas into the reaction chamber and expose the reaction chamber to a fourth plasma to thereby deposit a fourth film on surfaces of the reaction chamber, where the fourth source gas includes helium; receive a second substrate in the reaction chamber; and flow a fifth source gas into the reaction chamber and expose the reaction chamber to a fifth plasma to thereby deposit a fifth film on the second substrate, where at least one reaction parameter is different between depositing the second film on the substrate and depositing the fifth film on the second substrate, where the reaction parameter is selected from the group consisting of: a power used to generate plasma, a frequency used to generate plasma, plasma exposure time, reactants delivered to the reaction chamber, timing of delivery of reactants to the reaction chamber, flow rate of delivery of reactants to the reaction chamber, pressure, electrode gap and temperature.

In some cases, the controller may be configured to deposit the fourth film on surfaces of the reaction chamber without first cleaning the surfaces of the reaction chamber after the second film is deposited on the substrate. The resulting films on substrates may have very low levels of particle formation.

In another aspect of the disclosed embodiments, a method for depositing a film on a substrate is provided, including: flowing a source gas including TEOS into a reaction chamber having the substrate therein; generating a plasma; depositing film on the substrate; and purging the reaction chamber with a purge gas including helium for a duration of at least about 3 seconds.

In some embodiments, the helium may be swapped for another gas having a thermal conductivity of at least about 150 mW/(m*K) at about 150° C. In one example, hydrogen may be used in place of, or in addition to, helium.

These and other features will be described below with reference to the associated drawings.

BRIEF DESCRIPTION OF THE DRAWINGS

FIG. 10 is a table showing reaction conditions and the extent of particle formation on substrates for different processing conditions.

DETAILED DESCRIPTION

Figure 1:
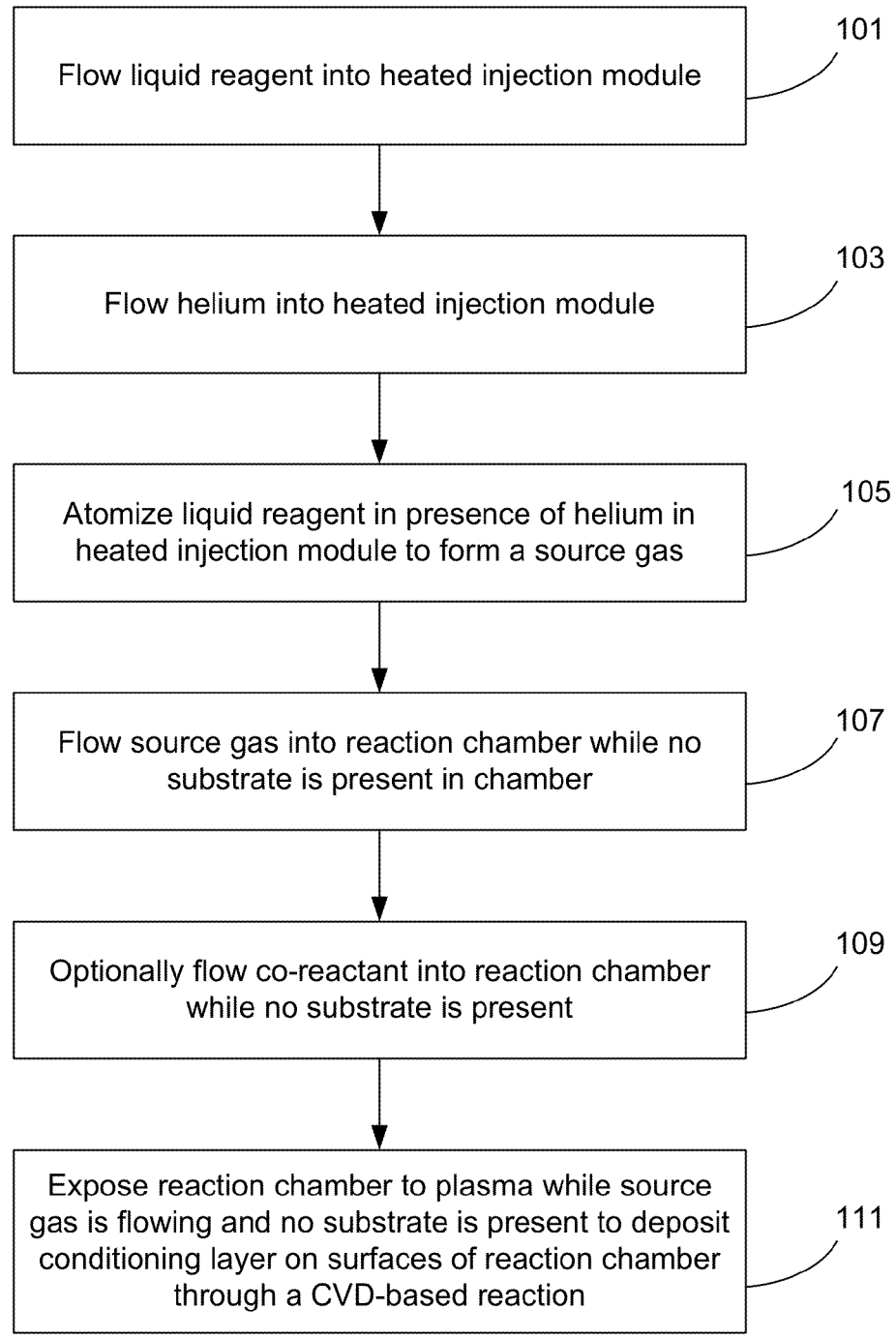
FIG. 1 shows a flowchart for a method of forming a conditioning layer on a reaction chamber through a chemical vapor deposition reaction.

In this application, the terms "semiconductor wafer," "wafer," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving towards the adoption of 450 mm diameter substrates. The flow rates and power levels provided herein are appropriate for processing on 300 mm substrate. One of ordinary skill in the art would appreciate that these flows may be adjusted as necessary for substrates of other sizes. In addition to reaction chambers used to deposit films on semiconductor wafers, other types of deposition reactors may take advantage of this invention. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments. For example, while much of the discussion herein focuses on film deposition using tetraethyl orthosilicate (TEOS) as a reagent, it is expected that any reagent that is liquid at room temperature may benefit from the disclosed techniques.

Conformal, uniform silicon dioxide ($SiO_2$) films and other dielectric films have many applications in semiconductor manufacturing. A common application for thin $SiO_2$ films is the electrical isolation of adjacent transistors. Electrical isolation can be achieved by physically separating adjacent transistor components with insulating silicon dioxide. Chemical vapor deposition (CVD) and plasma enhanced chemical vapor deposition (PECVD) are sometimes the method of choice for depositing silicon oxide films or other films for shallow trench isolation (STI), particularly where the features are relatively large. However, as devices continue to shrink, the aspect ratios (depth to width) of features increase, and traditional CVD techniques can no longer provide adequately conformal films in these high aspect ratio features.

One alternative to CVD is atomic layer deposition (ALD) processing and plasma enhanced atomic layer deposition (PEALD) processing. Unless otherwise noted, the term ALD is intended to include PEALD, and the term CVD is intended to include PECVD in the following description. ALD methods involve self-limiting adsorption of reactant gases and can provide thin, conformal dielectric films within high aspect ratio features. ALD methods have been developed for the deposition of silicon oxide and other types of film. Films produced by ALD are very thin (e.g., about one monolayer); therefore, numerous ALD cycles may be repeated to adequately fill a gap feature.

In contrast with a CVD process, where activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, energy provided to the substrate (e.g., thermal or plasma energy) activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between about 0.5 Å-3 Å thick.

Conformal films may also be deposited on planar substrates. For example, antireflective layers for lithographic patterning applications may be formed from planar stacks including alternating film types. Such antireflective layers may be approximately 100 Å-1000 Å thick, making slower ALD processes less attractive than faster CVD processes. However, such anti-reflective layers may also have a lower tolerance for within-wafer thickness variation than many CVD processes may provide. For example, a 600 Å thick antireflective layer may tolerate a thickness range of less than 3 Å.

A related deposition technique that presents a feasible alternative to CVD for small feature sizes is conformal film deposition (CFD). Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process (e.g., a purge step) may be shortened or eliminated in an example CFD process. In some cases, a reactant may be provided continuously. The continuously provided reactant is often a co-reactant/auxiliary reactant (e.g., an oxygen- or nitrogen-containing reactant, as opposed to a primary reactant such as one that contributes silicon to a final film). It is generally necessary, even in CFD processes, to minimize the amount of non-adsorbed principal reactant in the reaction chamber when the chamber is exposed to plasma. Otherwise, a gas phase CVD reaction may result. Typically, a chamber capable of performing an ALD process is also capable of performing a CFD process, and as used herein, a CFD process is considered to be a type of ALD process. In some implementations, the novel conditioning layer formation process may be used to deposit an undercoat and/or pre-deposition coat in a CVD, ALD or CFD reaction chamber (including reactors that utilize plasma).

As semiconductor device dimensions continue to shrink, fabrication methods have become increasingly sensitive to contamination. Example sources of such contamination in the context of chemical vapor deposition and atomic layer deposition processes are the formation of particles (e.g., small bin particles at about 0.04 μm) associated with precursor vaporization and post deposition purging. Defect formation is often exacerbated when a single tool is used to practice multiple recipes.

One technique for reducing the formation of contaminating particles is to condition the deposition chamber before it is used to deposit materials on substrates. Such conditioning may include depositing one or more conditioning layers (e.g., an undercoat and/or a pre-deposition coat) on the surfaces of the reaction chamber. Examples of surfaces that become coated include the chamber walls/ceiling/floor, pedestal, substrate carrier ring, showerhead, exhaust system, fluid line, pump, spindle, wafer transfer arm, filler plates, secondary purge collars, etc.

The chamber conditioning layer may be an undercoat and/or a pre-deposition coat. In various cases, both an undercoat and a pre-deposition coat are used. Typically, an undercoat and pre-deposition coat are formed through a similar process, and may use the same or different chemistries. However, an undercoat is generally formed first, on a bare/clean reaction chamber, at a relatively high deposition rate (e.g., between about 2000-5000 Å/min), and for a relatively short time (e.g., between about 30-90 seconds). In comparison, a pre-deposition coat may be formed on top of an undercoat, at a relatively lower deposition rate (e.g., between about 800-1800 Å/min), and for a relatively long time (e.g., between about 60-600, or 60-350 seconds). In some cases, a secondary pre-deposition coat may be deposited on chamber surfaces after the chamber is used to deposit film on substrates with a first recipe, and before the chamber is used to deposit film on substrates with a second recipe. This secondary pre-deposition coat may be used to condition the chamber such that it is ready to process the second recipe with minimal particle formation/defects. The secondary pre-deposition coat is sometimes referred to as a smart pre-deposition coat or smart pre-coat. Typically, the smart pre-deposition coat is deposited without removing the film buildup on chamber surfaces that was deposited during processing of the first recipe. A smart pre-deposition coat may be deposited by the same methods as a normal pre-deposition coat, with the exception that the deposition usually occurs over a shorter duration (e.g., between about 30-90 seconds). The smart pre-deposition coat allows a chamber to process multiple recipes without having to fully clean the reaction chamber, thereby saving time and increasing throughput. As used herein, conditioning layer can refer to an undercoat, a pre-deposition coat (sometimes referred to as a pre-coat), a secondary pre-deposition coat, or to a combination thereof, unless otherwise stated.

A conditioning layer is defined as a layer of film formed on the interior surfaces of the reaction chamber while no substrate is present in the reaction chamber, which is deposited for the purpose of coating the chamber for future processing of substrates. A conditioning layer is distinct from film buildup that occurs during a normal deposition process where material is deposited on substrates. In contrast to buildup that occurs during deposition on substrates, a conditioning layer is generally deposited without any substrates present in a reaction chamber. Further, an undercoat may be deposited directly on the bare chamber surfaces (e.g., on aluminum) or on a permanent layer on the chamber surfaces (e.g., aluminum fluoride), whereas film deposited during deposition on substrates is typically not in contact with these surfaces if it is deposited on top of a previously formed undercoat or pre-deposition coat. A substrate is a solid piece of material that may be inserted and removed from the reaction chamber, which is not part of the reaction chamber, upon which film is deposited, and upon which film deposition is generally desired. In the context of semiconductor device fabrication, a semiconductor wafer (with or without film(s) deposited thereon) is a typical substrate. In many cases, substrates are disc-shaped and have a diameter of, for example, 200, 300 or 450 mm. Substrates typically go through many rounds of processing to become semiconductor devices. Certain other substrates, however, are not intended to become fully functioning devices. These substrates may be referred to as dummy wafers, and they may be used as test vehicles for evaluating a deposition process or as sacrificial substrates for equilibrating a reaction chamber, for example. When depositing the one or more conditioning layers, the substrate-free chamber allows the conditioning layers to uniformly coat the chamber surfaces.

A conditioning layer is also distinct from a layer that may be deposited on chamber surfaces during certain test cycles, for example where a deposition process is run for a relatively small number of cycles without any substrates present. One difference is that the conditioning layer formation process may be practiced until reaching a desired minimum thickness of the conditioning layer. This minimum thickness is important in ensuring that the conditioning layer is able to function (e.g., minimize flaking and particle formation, and maximize uniformity) as desired. Another difference is that the conditioning layer formation process is undertaken specifically to prepare the chamber for processing substrates, whereas the test cycles are generally run for other purposes.

A conditioning layer can help improve wafer-to-wafer thickness uniformity and within-wafer thickness uniformity. The use of a chamber conditioning layer is especially beneficial in the context of a plasma processing apparatus, for example an apparatus used to deposit plasma enhanced atomic layer deposition (PEALD) films or plasma enhanced chemical vapor deposition (PECVD) films. Conditioning layers are often used to help reduce metal contamination and the formation of defect-inducing particles on the surfaces of the chamber. These particles can flake off the chamber surfaces and fall onto a substrate as film is being deposited, thereby causing undesirable film impurities and increasing the likelihood of device failure. Another advantage of using a conditioning layer on chamber surfaces is that it helps stabilize the impedance within a reactor.

Films deposited in reaction chambers lacking a conditioning layer often have substantial metal contamination problems. In many cases, the reaction chamber itself is made of a metal (e.g., aluminum). When an uncoated metal chamber is exposed to plasma, small amounts of metal may be removed from the chamber surfaces and end up on the substrate film. These metal impurities can negatively affect the performance of the devices formed on the substrate, and in some cases can lead to device failure. With regard to balancing impedance, the chamber conditioning layer is especially useful when depositing CVD-based films, which deposit through gas phase reactions. Because the reaction chamber is made of metal and the film deposited on substrates is often a dielectric material, the impedance of the reaction chamber changes as the dielectric is deposited. Thus, by providing a conditioning layer, the impedance of the chamber can become relatively stabilized before any substrates are processed, thereby maximizing processing uniformity.

In the past, the formation of contaminating particles smaller than about 0.2 µm, and later 0.1 µm, for example, were not considered to be problematic. Because these small particles were not typically causing issues during fabrication, it was not considered necessary to detect such particles. However, as the features on semiconductor devices become smaller, the minimum size of a problem causing particle also becomes smaller. With current technology at the 1× (14-18 nm) and 2× (22-28 nm) process nodes, particles having a size of at least about 0.04 µm are of particular importance.

In various embodiments herein, a chamber conditioning layer is deposited using a reagent that is liquid at room temperature. One example of such a reagent is tetraethyl orthosilicate (TEOS). Because the reagent is liquid at room temperature, it is heated/atomized before delivery to the reaction chamber in gaseous form. The liquid reagent may be delivered to a heated injection module, where it is atomized in the presence of hot gases. The hot gas/atomized reagent stream may then be delivered to the reaction chamber. It has been found that when forming a conditioning layer, the inclusion of helium in the hot gases results in the formation of a superior conditioning layer that minimizes particle contamination during subsequent processing. In certain embodiments, a different gas is used in place of helium. Any gas used in place of helium will generally have a high thermal conductivity (e.g., a thermal conductivity of at least about 150 mW/(m*K) at about 150° C.). Helium has a thermal conductivity of about 190.6 mW/(m*K) at about 400K (about 127° C.). One example gas that may be suitable is hydrogen. However, hydrogen may be more dangerous and costly to use than helium.

The conditioning layer may be formed through a PECVD or a PEALD reaction. A PECVD conditioning layer reaction involves supplying one or more gaseous reactants to a reaction chamber and exposing the chamber to plasma while the reactant(s) are being supplied. This results in a gas-phase reaction that deposits reaction products onto the surfaces of the reaction chamber. A PEALD conditioning layer reaction involves cyclically supplying one or more gaseous reactants to the reaction chamber, allowing the reactants to adsorb onto the chamber surfaces, and exposing the reaction chamber to plasma while the flow of at least one reactant is ceased. This results in a surface reaction that takes place directly on the surfaces where the reactants are adsorbed. In some PEALD reactions, the reactants are delivered separately, and a purge or sweep may be used after delivery of one or more of the reactants to remove residual reactants from the chamber.

One example PEALD process flow is as follows: (1) flow first reactant into reaction chamber and allow to adsorb onto chamber surfaces; (2) sweep/purge first reactant from reaction chamber; (3) flow second reactant into reaction chamber and allow second reactant to adsorb onto chamber surfaces; (4) sweep/purge second reactant from reaction chamber; (5) expose reaction chamber to plasma to drive a reaction between the first and second reactant; and (6) sweep/purge reaction chamber. This method may be repeated until a desired film thickness is reached. In some embodiments, one or more of the sweep/purges may be omitted.

Another example PEALD process may involve one or more reactants being delivered in a continuous manner. This type of reaction is sometimes referred to as a conformal film deposition (CFD) reaction. As noted above, whenever plasma is applied, the flow of at least one reactant (often a silicon-containing principal reactant) is stopped. This allows the reaction to occur in a self-limiting fashion. An example process flow for such a CFD reaction is as follows: (1) continuously flow first reactant into the reaction chamber; (2) deliver dose of second reactant to reaction chamber; (3) sweep/purge second reactant from reaction chamber; (4) expose reaction chamber to plasma; (5) sweep/purge reaction chamber. This method may be repeated to reach a desired film thickness. Unless otherwise stated, PEALD reactions as described herein are intended to include CFD reactions. CVD, ALD and CFD reactions are further discussed and described in the following U.S. patent applications, each of which is incorporated herein in its entirety: U.S. patent application Ser. No. 13/084,399, filed Apr. 11, 2011, and titled "PLASMA ACTIVATED CONFORMAL FILM DEPOSITION"; and U.S. patent application Ser. No. 13/224,240, filed Sep. 1, 2011, and titled "PLASMA ACTIVATED CONFORMAL DIELECTRIC FILM DEPOSITION."

Certain PECVD and PEALD reactions may use only a single reactant, while other reactions use two or more reactants. The particular reaction occurring is not intended to be limiting, and the embodiments disclosed herein are expected to be beneficial whenever at least one reactant used to form a conditioning layer is liquid at room temperature.

Figure 2:
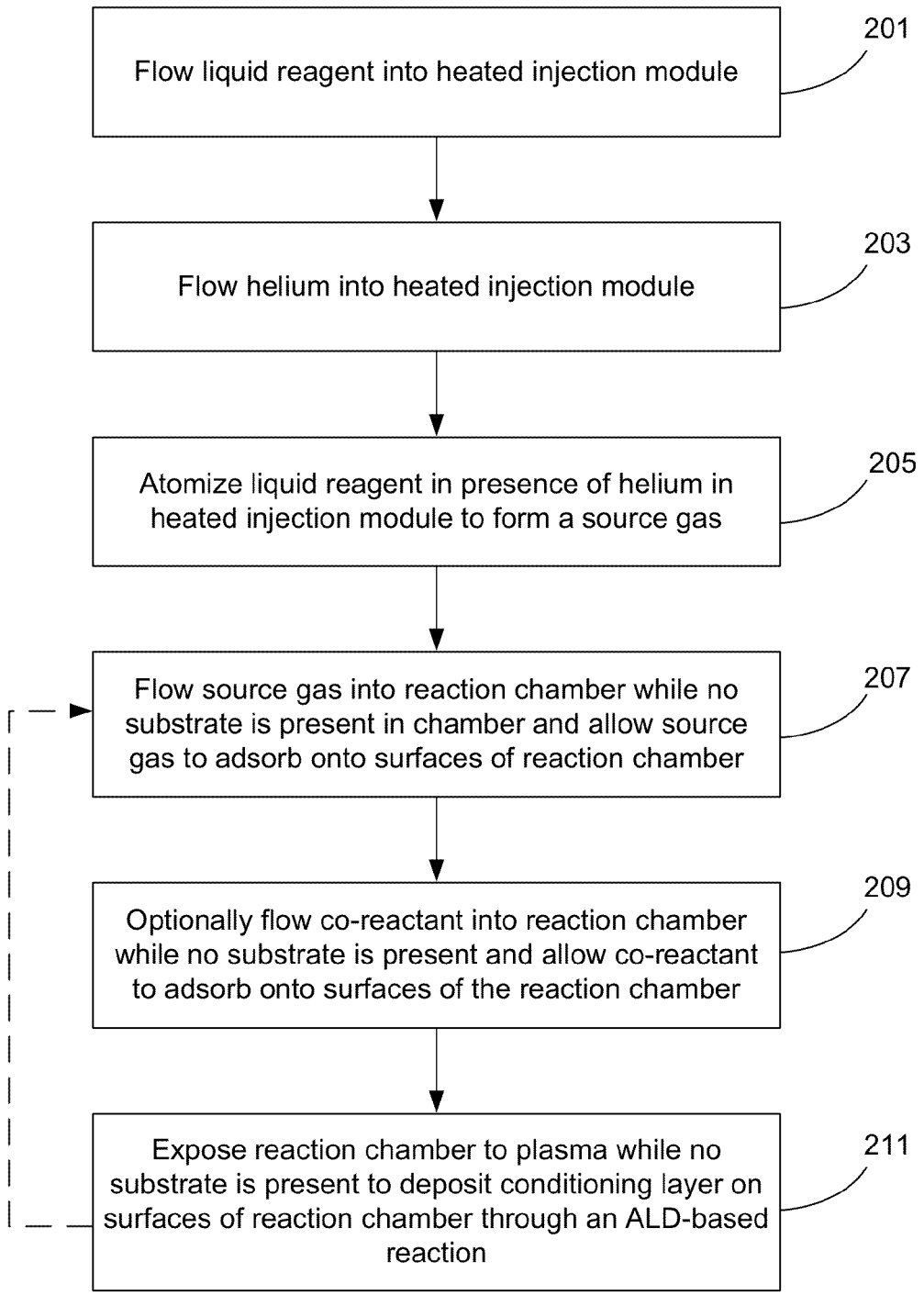
FIG. 2 shows a flowchart for a method of forming a conditioning layer on a reaction chamber through an atomic layer deposition reaction.

FIG. 1 provides a flowchart for a method of preparing a conditioning layer for a reaction chamber through a PECVD-based method, while FIG. 2 provides a flowchart for a method of preparing a conditioning layer through a PEALD-based method. After a reaction chamber receives one or more conditioning layers, it may be used, for example, for depositing CVD and/or ALD based films (including PECVD and PEALD based films).

With reference to FIG. 1, the method begins at operation 101 where liquid reagent is flowed into a heated injection module. In certain cases, the liquid reagent may be TEOS, though the embodiments are not so limited. Before delivery to the heated injection module, the liquid reagent may be held in a pressurized container (e.g., between about 25-55 psi). The liquid reagent may be at or near room temperature in the pressurized container. From here, the liquid reagent is pushed through a small nozzle having several orifices into to heated injection module. The orifices through which the liquid reagent flows as it enters the heated injection module are very small (e.g., between about 0.005-0.007" in diameter), and there is a substantial difference between the pressure in the interior of the heated injection module (where the pressure may be on the order of about 200 Torr) and the fluid passing through the orifices (a.k.a. the injector inlets, where the pressure may be on the order of about 25-35 psi, which is about 1200-1800 Torr). In some cases, the pressure difference between these two areas may be even greater, on the order of about 25-30×.

At operation 103, helium is flowed into the heated injection module, and at operation 105, the liquid reagent is atomized in the presence of helium, in the heated injection module to form a source gas. The atomized TEOS or other reagent in the source gas may be vaporized, or may become vaporized in a downstream conduit. Operations 101, 103 and 105 occur simultaneously such that the liquid reagent is atomized in the presence of the helium. The helium is hot as it passes through the heated injection module, and it helps maintain the liquid reagent in atomized form as it is carried to the reaction chamber for processing. Example temperatures for helium can range from about 80-180° C. In some embodiments, the TEOS or other liquid reagent flash vaporizes upon entering the heated injection module. In various embodiments, a co-reactant may be used. The co-reactant may be delivered separately or may be flowed into the heated injection module such that the liquid reagent is atomized in the presence of both helium and the co-reactant. One example co-reactant is oxygen ($O_2$), though the disclosure is not so limited.

One issue that arises where liquid reagents are used is that a portion of the liquid reagents can condense in the delivery lines, which can promote film defects and other process non-uniformities. It is believed that the small bin particles (e.g., at about 0.04 µm and below) recently detected on substrates may be caused by this type of precursor condensation. Where condensed precursor is present in a delivery line, it can react with other process gases that pass through the delivery line. The condensed precursor and additional processing gases can react with one another in the delivery lines to form particles, which pass through the delivery lines and can end up deposited on a substrate surface. This precursor condensation is particularly likely to occur if there is a cold spot in the reagent delivery line, even if the cold spot is only temporarily present. Various presently disclosed embodiments combat the precursor condensation issue by including helium in the delivery line. Helium gas has a high thermal conductivity, and has been found to be very effective in establishing and maintaining uniform gas temperature in the delivery line to the reaction chamber. Thus, by atomizing the liquid reagent in the presence of helium in the heated injection module and using helium as a carrier gas for delivering the liquid reagent to the reaction chamber, the transient cold spots in the reagent delivery system can be minimized or avoided. The result is more uniform gas temperature, more uniform atomization/vaporization of reagent, better prevention of reagent condensation, and ultimately a chamber conditioning layer that better prevents formation of defects on subsequently deposited films on substrates.

Returning to FIG. 1, the method continues at operation 107 where the source gas is flowed into the reaction chamber while no substrate is present in the reaction chamber. At operation 109, a co-reactant may be optionally flowed into the reaction chamber. As mentioned, the co-reactant may flow with the atomized liquid reagent and helium from the heated injection module, or it may be provided separately. The use of a co-reactant will depend on the particular chemistry being used. In a particular example, the liquid reagent is TEOS, the co-reactant is oxygen, and they are both delivered to a single heated injection module along with the helium to form a single source gas for deposition of a TEOS oxide conditioning layer. Where a co-reactant is used in a CVD-based reaction, the co-reactant can be delivered simultaneously with the atomized liquid reagent/helium.

Next, at operation 111 the reaction chamber is exposed to plasma while no substrate is present in the chamber. The plasma exposure occurs while the source gas and optional co-reactant are flowing into the reaction chamber. This plasma exposure results in the deposition of a conditioning layer on the surfaces of the reaction chamber. The conditioning layer may be an undercoat or a pre-deposition coat. In some embodiments, the method is repeated to first form an undercoat and then form a pre-deposition coat on the undercoat. As mentioned above, the undercoat is typically deposited at a higher deposition rate, and for a shorter time period, than the pre-deposition coat.

FIG. 2 presents a flowchart for a method of depositing a conditioning layer on surfaces of a reaction chamber through a PEALD-based reaction. Operations 201, 203 and 205 correspond to operations 101, 103 and 105 of FIG. 1, and will be discussed in less detail than above. At operation 201, liquid reagent is flowed into a heated injection module. At operation 203, helium is flowed into the heated injection module. The liquid reagent is atomized in the heated injection module in the presence of helium at operation 205. This forms the source gas that is flowed into the reaction chamber at operation 207. Like the example above, the source gas is flowed into the reaction chamber while no substrate is present in the chamber. One difference between the ALD-based method of FIG. 2 and the CVD-based method of FIG. 1 is that in the ALD-based method, the source gas is allowed to adsorb onto the surfaces of the reaction chamber. Optionally, a co-reactant may be flowed into the reaction chamber at operation 209. The co-reactant may also be allowed to adsorb onto the surfaces of the reaction chamber. After the source gas and optional co-reactant become adsorbed on the chamber surfaces, the reaction chamber is exposed to plasma at operation 211. During the plasma exposure, no substrate is present in the reaction chamber. This results in the deposition of a conditioning layer through an ALD-based surface reaction on all exposed chamber surfaces. The method may be repeated to form a conditioning film layer of desired thickness. Although FIG. 2 shows the method repeating from operation 207 onwards, it is understood that operations 201-205 occur to provide source gas as needed. The method of FIG. 2 may be used to form an undercoat and/or a pre-deposition coat.

Figure 3:
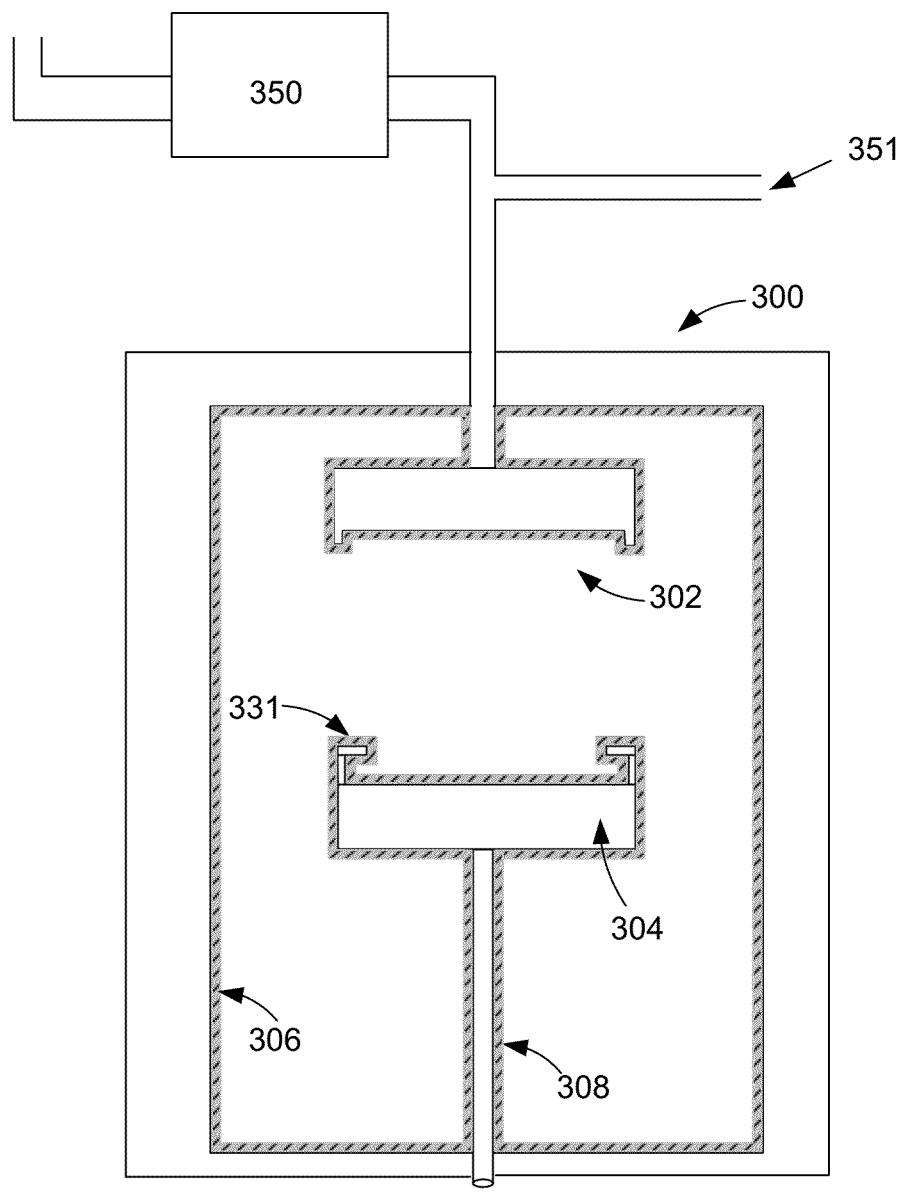
FIG. 3 shows a simplified depiction of a reaction chamber having a conditioning layer thereon.

FIG. 3 illustrates a simplified reaction chamber having a conditioning layer thereon. When used to deposit films on substrates, the substrate (not shown) is positioned on the substrate carrier ring 331, which is supported by pedestal 304 (also referred to as a substrate support), which is supported by support pillar 308. Process gases are provided to the reaction chamber through inlet 351. In this embodiment, a remote plasma generator 350 may be used to generate plasma. After passing through inlet 351, reactants and other process gases enter the reaction chamber through showerhead 302. The interior surfaces of the reaction chamber (including at least the showerhead 302, support 308, pedestal 304, substrate carrier ring 331, and the walls, floor and ceiling of the reaction chamber 300) are coated with undercoat 306. The thickness of undercoat 306 has been exaggerated for the purpose of illustration. In some embodiments, a carrier ring is moveable between up and down positions. In some embodiments, an undercoat deposition may be performed with the carrier ring in an up position such that all surfaces are accessible for deposition.

Figure 4A:
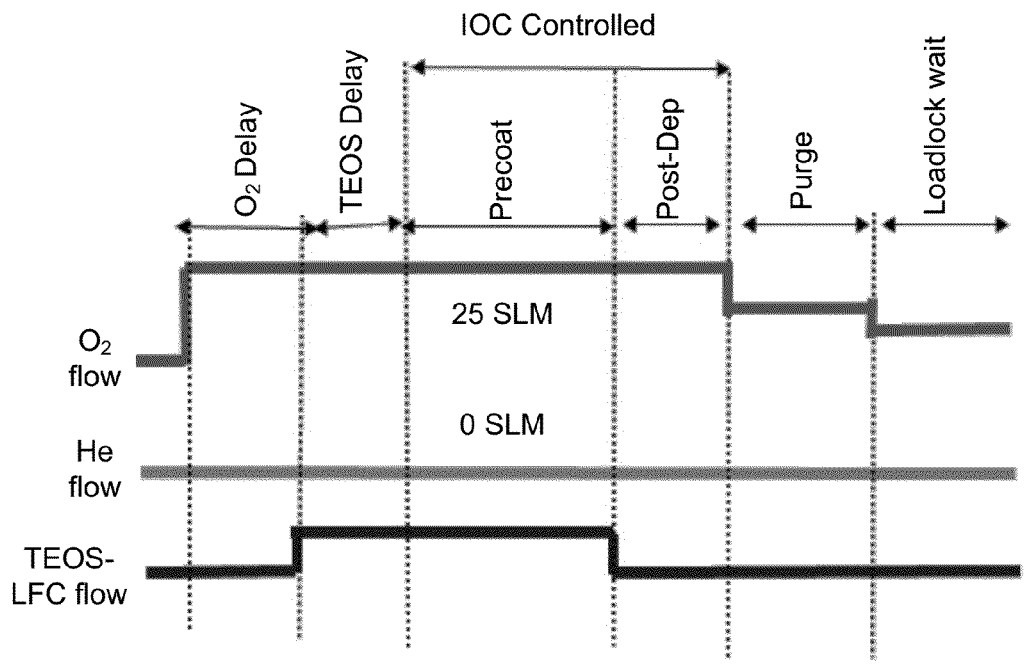
FIGS. 4A and 4B show timing diagrams for alternative methods of depositing a conditioning layer on a reaction chamber.
Figure 4B:
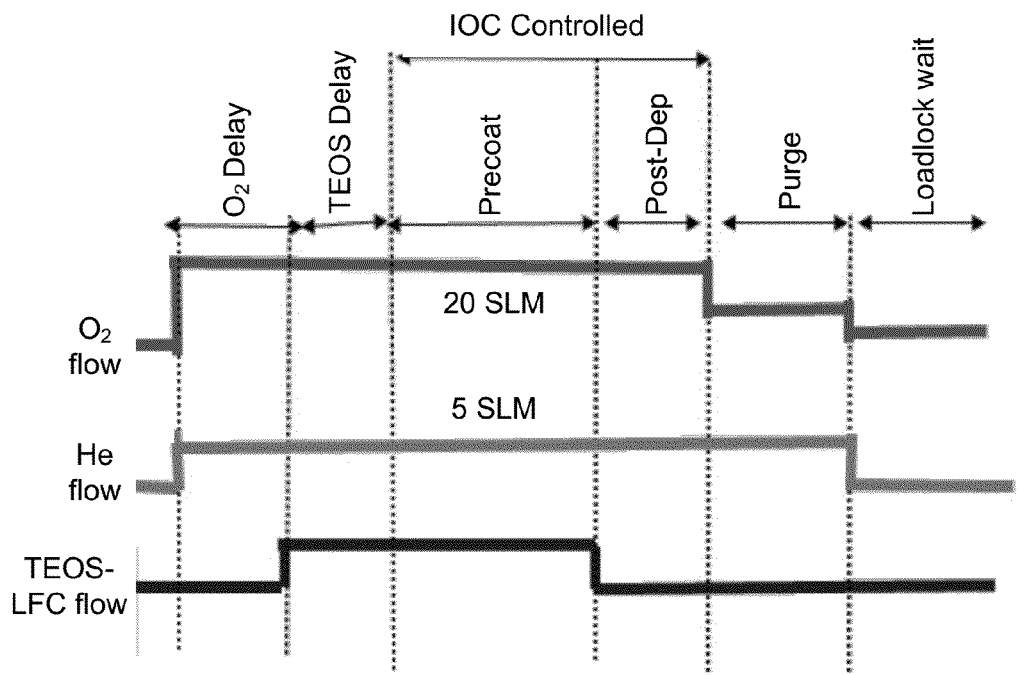

FIGS. 4A and 4B show example timing diagrams for deposition of a conditioning layer through a PECVD-based reaction. FIG. 4A relates to a method where no helium is used in depositing the conditioning layer. In contrast, FIG. 4B relates to an embodiment where helium is provided during formation of the conditioning layer. Both figures relate to the deposition of a silicon oxide conditioning layer using TEOS and oxygen. With respect to FIGS. 4A and 4B, the $O_2$ Delay is the time period in which oxygen is flowing to the reaction chamber but TEOS is not. This period may last between about 3-8 seconds, for example. The flow rate of oxygen (or other co-reactant, where used) may be between about 8-25 standard liters per minute (SLM). The flow rates herein are appropriate for a 300 mm wafer and may be scaled as needed for substrates of other sizes. The flow rates scale linearly based on the area of the substrate. For example, a flow rate of 8-25 SLM oxygen for a 300 mm wafer would scale to a flow rate of about 18-55 SLM TEOS for a 450 mm wafer. TEOS begins flowing into the reaction chamber at the start of the TEOS Delay period. This period may last between about 3-10 seconds in one example, and the TEOS may flow at a rate less than about 10 mL/min, or less than about 5 mL/min, for example between about 0.5-2.5 mL/min. These TEOS flow rates are measured based on the volume of TEOS before it is atomized. The O2 Delay and the TEOS Delay may be used to help establish and stabilize the oxygen and TEOS flows into the reaction chamber.

Plasma is applied during the Precoat and Post-Dep periods. Example durations for the Precoat period may be between about 30-600 seconds (e.g., between about 30-90 seconds for deposition of an undercoat or a secondary pre-deposition coat, and between about 60-600 seconds, or between about 60-350 seconds for deposition of a pre-deposition coat). The Post-Dep period may have a duration between about 3-6 seconds. The RF power used to excite the plasma may be between about 100-2500 W/station. The TEOS flow ends at the end of the Precoat period, before the plasma is extinguished. This allows most of the residual TEOS to be processed or removed from the chamber. The process conditions experienced during the Precoat period are important in controlling the quality of the conditioning layer that forms. One problem that arises is that the temperature of the process gases can fluctuate over the long Precoat period. The chamber hardware and deposition process are sensitive to such temperature changes. As such, it is desired to maintain the process gases at a uniform temperature over this entire period, and throughout all parts of the integrated liquid delivery system. In contrast, when material is being deposited on substrates, the deposition time is often much shorter, and the gas temperature fluctuation problem is less substantial.

The Purge period may have a duration between about 3-10 seconds, for example. The flow rate of purge gas may be between about 0-10 SLM. The reaction chamber may be pumped down to a base pressure (e.g., between about 40-80 mTorr) during this time. In the embodiment shown in FIG. 4A, the purge gas is oxygen, while in FIG. 4B, the purge gas includes both oxygen and helium. The purge gas may include between about 50-80% helium, as measured by volume (SLM). The Loadlock period refers to the time period after the purge, before the loadlock opens. The flow of helium may stop during this period, as shown in FIG. 4B. The Loadlock period may have a duration between about 3-6 seconds, for example. During this conditioning layer deposition process, the reaction chamber pressure will typically be between about 1-10 Torr, for example between about 2-4 Torr. The temperature of the substrate may be maintained between about 180-550° C.

Where an RF plasma generator is used to generate the plasma, the RF power may be between about 400-3200 W, for example between about 100-800 W/station, as calculated for a 300 mm diameter wafer deposited in a four-station reactor. The power level scales linearly with substrate area, and may be scaled accordingly for substrates of other sizes. For example, an RF power of 500 W/station for a 300 mm wafer would correspond to an RF power of about 1125 W/station for a 450 mm wafer. The RF frequency used to drive the plasma may have a high frequency (HF) and/or low frequency (LF) component. Example HF RF frequencies may include, but are not limited to, frequencies between about 1.8 MHz-2.45 GHz. Common HF frequencies include 13.56 MHz and 27 MHz. Example LF frequencies may include, but are not limited to, frequencies between about 50-500 kHz. In some embodiments, only HF frequency is used. In other embodiments, LF frequencies are used in addition to HF frequencies. In other embodiments, only an LF frequency is used.

In the presently disclosed embodiment of FIG. 4B, helium is provided to the reaction chamber during all parts of the conditioning layer deposition process except the Loadlock period. The helium may be provided at a steady rate, or its flow may increase/decrease as needed. In certain embodiments, the helium flows at a rate between about 1-10 SLM, for example between about 4-8 SLM during each step. The inclusion of helium, particularly where it is flowed through a heated injection module whenever a liquid reagent such as TEOS is being delivered, helps promote formation of a high quality conditioning layer that is useful in preventing the formation of particles/defects when the reaction chamber is subsequently used to deposit films on substrates. Because helium has a high thermal conductivity, its inclusion in the TEOS atomization and delivery process helps maintain uniform gas temperature, which reduces the likelihood of forming cold spots that can lead to condensation of TEOS before reaching the reaction chamber. By reducing or avoiding the formation of cold spots, the TEOS is better able to remain atomized/gaseous, and a higher quality conditioning layer results.

Figure 5:
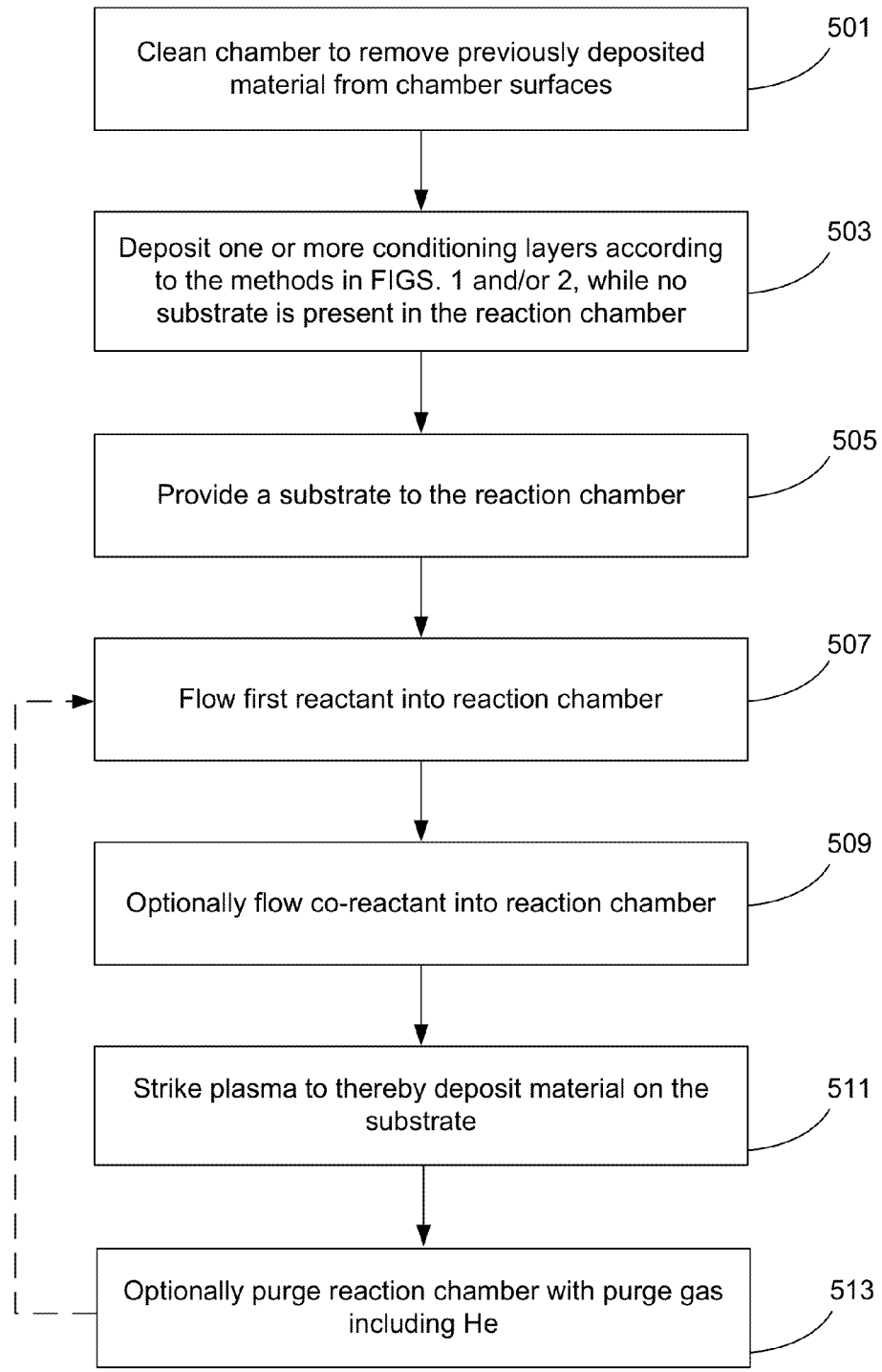
FIG. 5 shows a flowchart for a method of preparing a reaction chamber and depositing film on substrates.

FIG. 5 presents a flowchart for a method of preparing a reaction chamber and depositing film on substrates. The method begins at operation 501, where the reaction chamber is cleaned to remove previously deposited material from the chamber surfaces. This cleaning method may be accomplished through a plasma clean, a wet clean, or a combination thereof, and is further discussed below. Any appropriate chamber cleaning methods may be used. In some embodiments, the reaction chamber starts from a clean state and operation 501 is not needed. Next, at operation 503, one or more conditioning layers (e.g., an undercoat and/or a precoat) is deposited according to the methods outlined above with respect to FIGS. 1 and 2. The conditioning layers are deposited without any substrate present in the reaction chamber. After the one or more conditioning layers are formed, a substrate may be provided to the reaction chamber at operation 505.

Operations 507-513 relate to depositing a film on a substrate. The deposition may occur through a CVD reaction or an ALD reaction, for example. Where a CVD reaction is desired, the first reactant (e.g., TEOS) and optional co-reactant (e.g., oxygen) are flowed into the reaction chamber at least partially at the same time, and the reaction chamber is exposed to plasma while the reactants are flowing to the chamber. In other words, there is a timing overlap between operations 507, 509 and 511. Although these operations may not begin and end at the same time, there is at least some period where they occur together. Where no co-reactant is used, there is a timing overlap between operations 507 and 511. Another possibility is to deposit material on substrates through an ALD reaction. Where this is the case, operations 507 and 511 occur in a cyclic manner such that the first reactant is delivered to the reaction chamber in 507 before the plasma is struck at 511. In various cases, the reaction chamber may be purged after operation 507 and before operation 511 to remove unadsorbed first reactant from the reaction chamber. As mentioned above, in operation 509 the co-reactant may be provided in a cyclic manner, or may be provided continuously.

In certain embodiments, substantially no helium is provided to the reaction chamber during deposition on substrates except possibly during a dedicated purge operation. As used herein, substantially no helium means trace amounts of helium or less. In other embodiments, helium may be provided as part of a source gas during deposition. The inclusion of helium in the source gas (e.g., along with TEOS or another liquid reagent) may be useful where high liquid reagent flow rates are used (e.g., greater than about 10 mL/min, as measured before the TEOS is atomized). The use of helium in a source gas is further described in U.S. Pat. No. 7,926,376, which is incorporated by reference herein in its entirety. In embodiments using lower liquid reagent flow rates, the helium may be omitted from the source gas. It may be desirable to omit helium in the source gas when depositing on substrates at low TEOS flows because the helium provides only minimal deposition benefits at these low flow rates, and because helium is fairly expensive. In contrast, helium has been shown to result in formation of a superior quality conditioning layer on chamber surfaces, even at low TEOS flow rates.

Next, the reaction chamber may be optionally purged to remove any non-adsorbed species and byproducts at operation 513. The gas used to purge the reaction chamber may include helium. It has been found that the inclusion of helium in a post-deposition purge gas can substantially reduce the amount of particle formation seen on substrates. The helium helps minimize residues from liquid reagents (e.g., TEOS) that can build up in the chamber and integrated liquid delivery system (ILDS) after each cycle. Where deposition on substrates occurs through a CVD reaction, this purge may occur after the plasma is extinguished. Where deposition on substrates occurs through an ALD reaction, this purge may occur cyclically after each iteration of deposition (i.e., after each time the plasma is extinguished). The dotted arrow in FIG. 5 relates to the process flow where ALD deposition is used. Previously, helium was not included in the purge gas at least partially because there was no recognized need to do so. Until very recently, particle detection on wafers has only looked for particles having a diameter of at least about 0.1 μm. Particles under this size were, for the most part, not causing defect problems in the semiconductor devices. Because the formation of larger particles can be adequately minimized or avoided without using a helium purge, there was no motivation to include helium in the purge gas. Because helium is fairly costly, there was an incentive to not use it unless it was truly beneficial or necessary. However, as the industry marches forward and features have become smaller, the small bin particles (e.g., at about 0.04 μm and below) have begun to pose a more significant problem. As such, there is now a recognized need for improved methods that minimize formation of small bin particles. The inclusion of helium in the purge gas has been shown to be an effective method for minimizing such particle formation.

In some embodiments, a mixed recipe mode is used to deposit film on substrates. In this case, a first recipe is used to deposit film on a first number of substrates, before a second recipe is used to deposit film on a second number of substrates, all within the same reaction chamber. After deposition on substrates using the first recipe, a secondary pre-deposition coat (a.k.a. a smart pre-deposition coat) may be deposited. The smart pre-deposition coat may be deposited according to the methods in FIGS. 1 and 2, for example. A relatively short timeframe (e.g., between about 30-90 seconds, for example about 60 seconds) may be used for the deposition. The smart pre-deposition coat prepares the chamber for depositing material on substrates using the second recipe. Two recipes are considered to be different if, for example, they use different reaction parameters such as plasma ignition conditions (RF power, RF frequency, RF exposure time), different flow rates of reactants, different reactants, different pressure, different temperature, different electrode gap, different timing, etc. One of ordinary skill might be motivated to use different recipes on the same reaction chamber in order to deposit layers for different applications using a single tool. The ability to change recipes makes the reactor more robust, and minimizes the need to purchase additional costly manufacturing equipment.

Figure 6A:
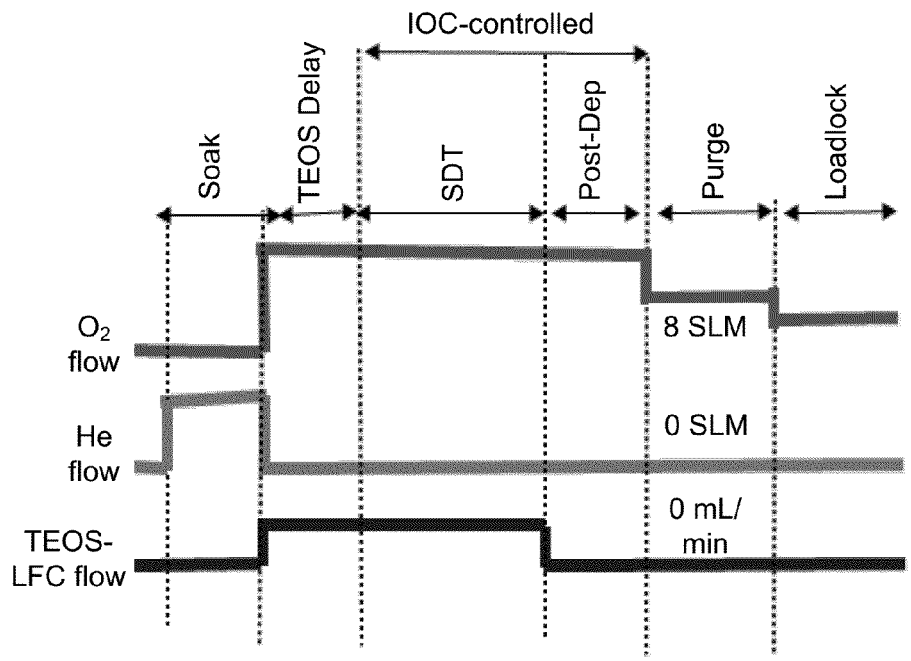
FIGS. 6A and 6B present timing diagrams for alternative methods of depositing film on substrates.
Figure 6B:
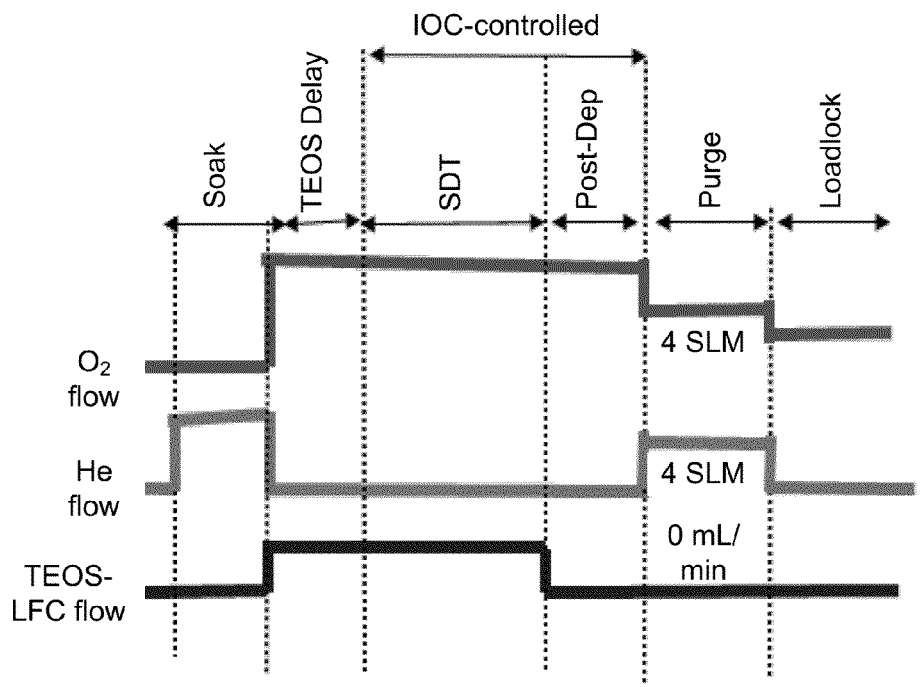

FIGS. 6A and 6B show timing diagrams for different methods of depositing material on substrates through a CVD reaction using TEOS and oxygen. These methods may be practiced in a reaction chamber having one or more conditioning layers as described herein. With respect to FIGS. 6A and 6B, the Soak period refers to the time where a substrate is present in the reaction chamber before any reactants are delivered to the reaction chamber. An inert gas, e.g., helium, may be flowed into the reaction chamber to help the substrate reach a desired temperature before further processing. The TEOS Delay period is when the TEOS and oxygen begin flowing to the reaction chamber. The Station Deposition Time period (labeled SDT) is the time period where plasma exposure begins. Plasma is exposed to the reaction chamber from the beginning of the SDT period through the end of the Post-Dep period. At the beginning of the Post-Dep period, the flow of TEOS is ceased. By stopping the flow of TEOS before the plasma is extinguished, the amount of residual TEOS remaining in the chamber can be minimized. In the Purge period, sometimes referred to as a post-deposition purge period, oxygen flows to the reaction chamber to help remove residual TEOS and byproducts. In the present embodiment of FIG. 6B, the purge gas also includes helium. Next, during the Loadlock period, the flow of all gases is reduced or stopped while the substrate waits for transfer through a loadlock mechanism. The flow of helium, in particular, may be stopped during the Loadlock period, to save materials and costs. There may be a flow of one or more gases during this time, for example a flow of oxygen or another co-reactant. The flow of gas during the Loadlock period is provided for the purpose of wafer exchange (e.g., at about 0.5 Torr). The flow rate of gas during the Loadlock period may be between about 3-5 SLM.

In certain embodiments, the Soak period may have a duration between about 8-15 seconds. The flow of helium or other gas during this time may be between about 10-20 SLM. The TEOS Delay period may have a duration between about 3-10 seconds. The flow rate of TEOS may be between about 0.5-2.5 mL/min, for example between about 0.6-1.5 mL/min, as measured before the TEOS is atomized. The flow rate of oxygen may be between about 8-25 SLM. These TEOS and oxygen flows may be maintained throughout the Precoat period, as well. The Station Deposition Time period may have a duration between about 1.5-5 seconds in certain embodiments. In other cases, deposition times outside this range may be used. The Post Dep period, when plasma is still present but the flow of TEOS has ceased, may have a duration between about 3-5 seconds. In various cases, the flow rate of helium is zero or substantially zero (i.e., only trace amounts) during the TEOS Delay, SDT and Post-Dep periods. Next, the post-deposition Purge period may have a duration between about 3-10 seconds. The reaction chamber may be pumped down to a base pressure (e.g., between about 40-80 mTorr) during this time. As shown in FIG. 6B, the purge gas may include helium and a co-reactant (oxygen in this example). The flow rate of purge gas may be between about 1-10 SLM, and the composition of the purge gas may be between about 50-80% helium, as measured by volume (SLM). The Loadlock period may have a duration between about 3-6 seconds.

During this deposition process on substrates, the reaction chamber pressure will typically be between about 1-10 Torr, for example between about 2-4 Torr. The temperature of the substrate may be maintained between about 180-550° C.

Where an RF plasma generator is used to generate the plasma used for depositing on substrates, the RF power may be between about 400-3200 W total, for example between about 100-800 W/station, as calculated for a 300 mm diameter wafer in a four-station deposition reactor. The RF frequency used to drive the plasma may have a high frequency (HF) and/or low frequency (LF) component.

The disclosed embodiments may be employed to deposit any of a number of different types of film. While most of the examples presented herein concern dielectric materials, the disclosed processes may be employed to form films of conductive and semiconductor materials as well. Nitrides and oxides are featured dielectric materials, but carbides, oxynitrides, carbon-doped oxides, borides, etc. may also be formed. Oxides include a wide range of materials including undoped silicate glass (USG), doped silicate glass. Examples of doped glasses included boron doped silicate glass (BSG), phosphorus doped silicate glass (PSG), and boron phosphorus doped silicate glass (BPSG).

The embodiments herein may be practiced with a variety of reactants. It is expected that the disclosed embodiments will be particularly beneficial in any case where a liquid reactant is vaporized/atomized before delivery in a gaseous state to a reaction chamber, or more generally, where a reactant process gas is likely to condense if it comes into contact with a cold surface/area. Examples of reactants that may benefit from the disclosed embodiments include, but are not limited to, TEOS, cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(triehtoxysilyl)ethane (BTEOSE), bis(trimethoxysilyl)ethane (BTMOSE), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS). In general, other likely precursor candidates include various liquid siloxanes (linear and cyclic) and silanes.

In certain cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethylamido titanium, hafnium tetrakis(ethylmethylamide), bis(cyclopentadienyl)manganese, bis(n-propylcyclopentadienyl) magnesium, etc.

The embodiments may also be practiced with a variety of co-reactants. The co-reactants are often, but not always, nitrogen- or oxygen-containing reactants. Example nitrogen-containing co-reactants include, but are not limited to, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Examples of oxygen-containing co-reactants include oxygen, ozone, nitrous oxide, carbon monoxide, nitric oxide, nitrogen dioxide, sulfur oxide, sulfur dioxide, oxygen-containing hydrocarbons ($C_xH_yO_z$), water, mixtures thereof, etc.

As mentioned above with respect to FIG. 5, the chamber may be cleaned before depositing a conditioning layer thereon. Cleaning may occur after a total of about 10 μm of film is deposited on substrates. The disclosed embodiments are not limited to any particular chamber cleaning method. Any method that removes all or substantially all of the deposited film and undercoat may be used. Chamber cleaning methods are further discussed and described in the following U.S. patents and patent applications, each of which is incorporated herein in its entirety and for all purposes: U.S. Pat. No. 7,479,191; U.S. Pat. No. 8,262,800; U.S. patent application Ser. No. 12/355,601, filed Jan. 16, 2009, and titled "PLASMA CLEAN METHOD FOR DEPOSITION CHAMBER"; and U.S. patent application Ser. No. 13/654,303, filed Oct. 17, 2012, and titled "METHODS AND APPARATUS FOR CLEANING DEPOSITION CHAMBERS."

There are two general types of chamber cleaning methods that are frequently used to clean deposition chambers. These include plasma cleaning methods (sometimes referred to as dry cleaning methods) and wet cleaning methods.

Plasma cleaning procedures can be done using in situ chamber cleans or remote chamber cleans. In in situ chamber cleans, the chamber clean chemicals are introduced into the reaction chamber in a gaseous state and plasma excitation within the reaction chamber is used to dissociate the chamber clean chemicals into reactive radicals and ions. In remote cleans, an independent plasma source is used to dissociate the gaseous chamber clean chemicals into strongly reactive radicals and ions outside the reaction chamber, and the dissociated chamber clean chemicals are then introduced into the reaction chamber. In both in situ and remote chamber cleans, the reactive species in the chamber react with the accumulated deposited films and undercoat to form gaseous products that are evacuated from the chamber. In many cases, the chamber clean chemicals include fluorine-containing species, for example $NF_3$ that may be optionally mixed with inert gas such as He or Ar. Where a fluorine-containing cleaning chemical is used, $SiO_2$ present in the chamber may be converted to $SiF_4$, a volatile substance that may be removed by purging (e.g., sweeping and/or evacuating) the reaction chamber.

After a number of plasma cleaning cycles, the substrate deposition process may degrade and a wet clean may be used. In wet cleaning procedures, the reaction chamber is vented to atmosphere and the interior surfaces of the reactor are physically scrubbed using appropriate cleaning solutions (e.g., isopropanol (IPA) and/or water) and/or abrasives. Wet cleaning removes any thick and flaked accumulation that was not cleaned effectively with the plasma cleaning methods. This type of cleaning procedure is time consuming, labor intensive, and may require reconditioning of the chamber once completed. For example, the wet cleaning method may remove the layer of aluminum fluoride under the undercoat. As such, the wet cleaning methods are used sparingly and the plasma cleaning methods are used when possible.

Apparatus

The methods described herein may be performed by any suitable apparatus. A suitable apparatus includes hardware for accomplishing the process operations and a system controller having instructions for controlling process operations in accordance with the present invention. In some embodiments, the hardware may include one or more process stations included in a process tool.

Figure 7:
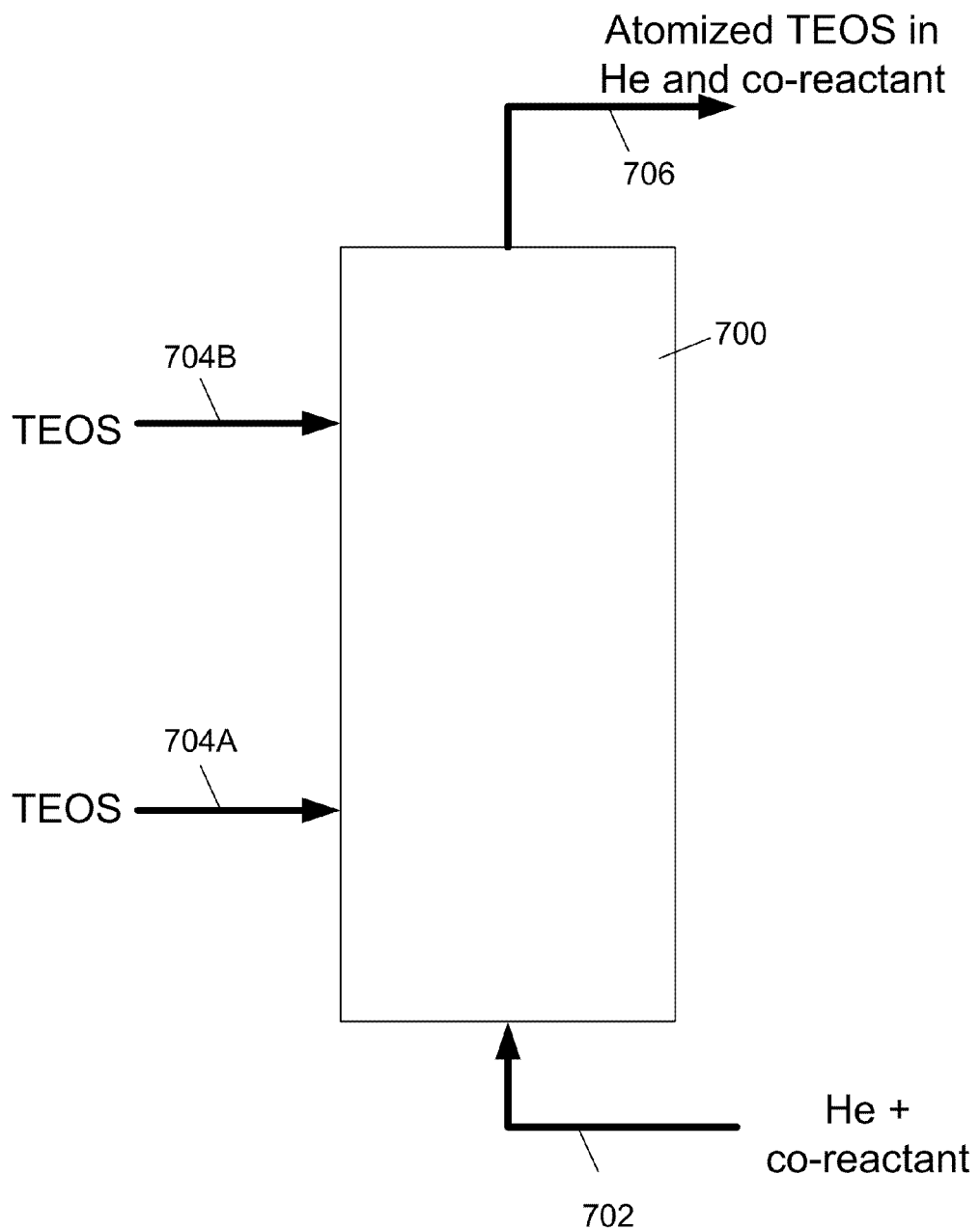
FIG. 7 illustrates a simplified depiction of a heated injection module.

FIG. 7 shows a simplified representation of a heated injection module 700 used in the context of deposition using TEOS and a co-reactant such as oxygen. The helium and optional co-reactant are delivered through conduit 702. The helium and co-reactant are typically heated to between about 80-180° C., for example about 150° C. TEOS is introduced through one or more conduits, shown in FIG. 7 as conduits 704A and 704B. The TEOS passing through these conduits 704A and 704B is pressurized, for example between about 25-55 psi. In one example the TEOS is pressurized to about 25 psi. The TEOS passes through very fine orifices (not shown) as it flows into the heated injection module 700. There is a substantial pressure differential between the incoming TEOS passing through the orifices and the interior of the heated injection module 700. This pressure differential, along with the presence of the hot helium and co-reactant, cause the TEOS to atomize into tiny microdroplets. In this state, the TEOS is carried by the helium and co-reactant out of the heated injection module 700 through conduit 706. The atomized TEOS may be vaporized in conduit 706, which may also be heated. Alternatively or in addition, the TEOS may flash vaporize as it enters the heated injection module. The conduit 706 may lead to a reaction chamber. The inclusion of helium in this atomization process helps ensure that conduit 706 leading to the reaction chamber and the gas therein are maintained at a stable, uniform temperature.

One alternative method for vaporizing the liquid reagent is to use a bubbler. With this technique, carrier gas (e.g., helium or helium mixed with a co-reactant) is bubbled through a container holding the liquid reagent. The liquid reagent and/or the carrier gas may be heated to aid vaporization. As the bubbles travel through the liquid reagent, some amount of the liquid reagent vaporizes and is carried out with the carrier gas. This bubbler method requires a large volume of carrier gas to vaporize a sufficient amount of liquid reagent. In contrast, where a heated injection module is used, the vaporization/atomization is much more effective, and substantially less carrier gas is required.

Figure 8:
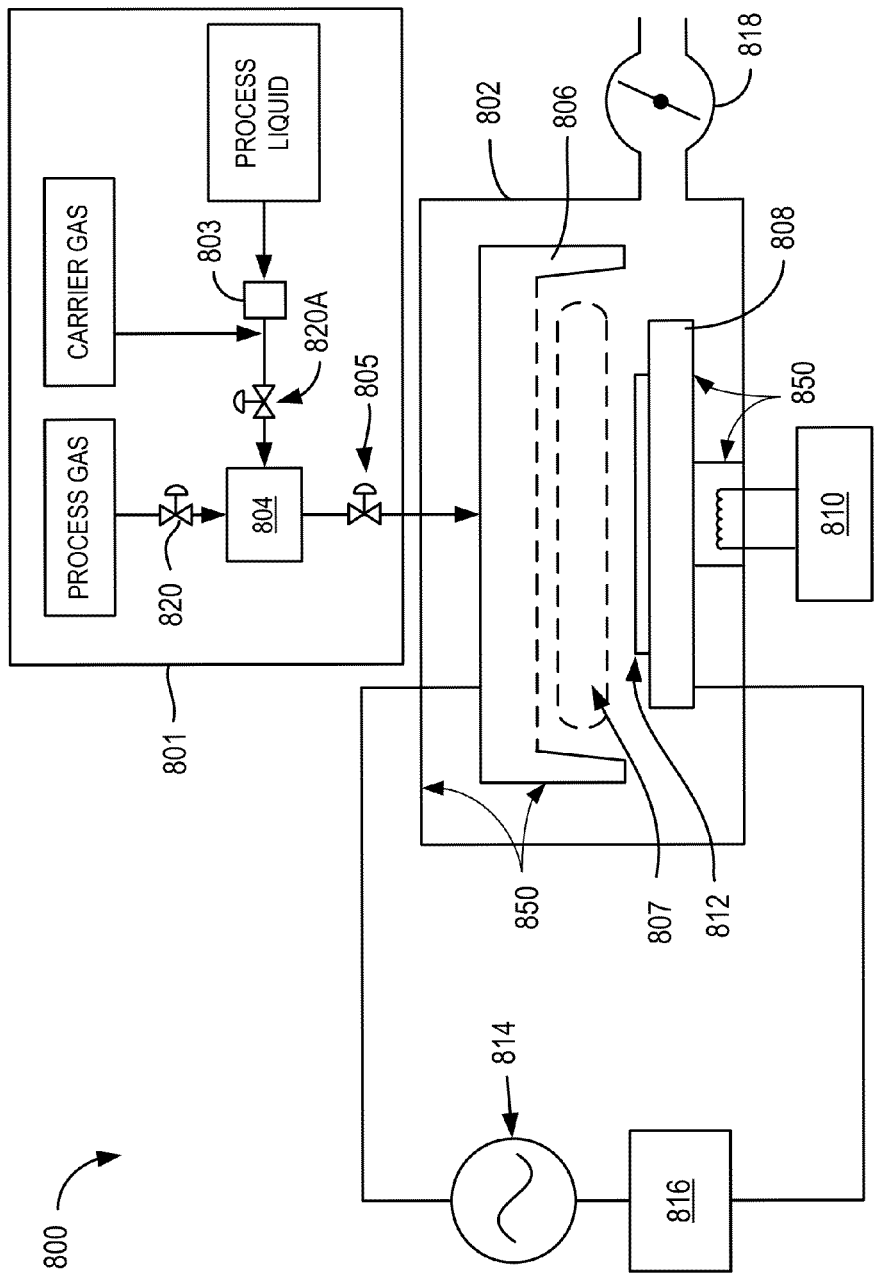
FIG. 8 shows a reaction chamber that may be used to practice the disclosed embodiments.
Figure 9:
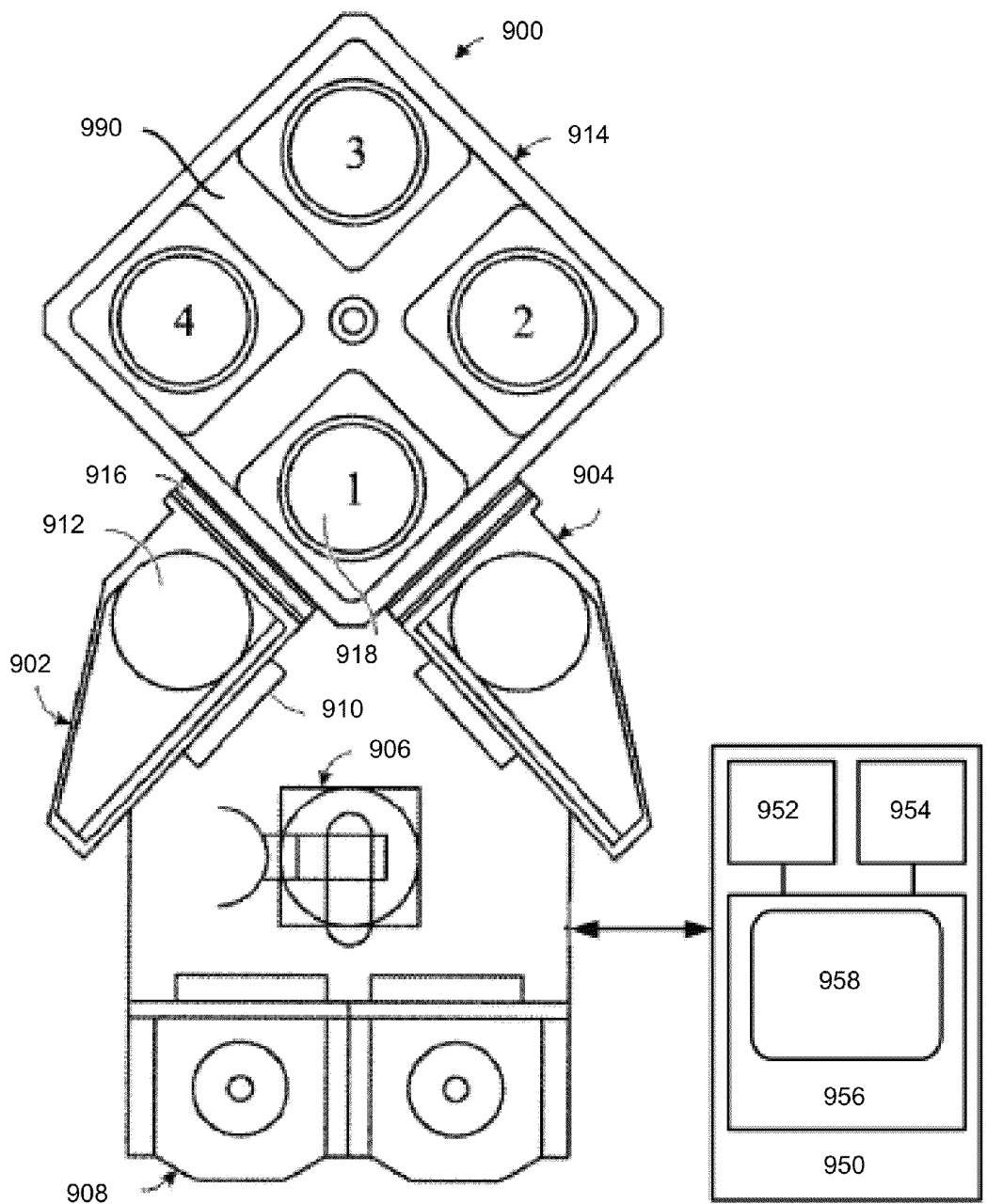
FIG. 9 illustrates a multi-tool apparatus in accordance with certain disclosed embodiments.

FIG. 8 schematically shows an embodiment of a reaction chamber process station 800. For simplicity, process station 800 is depicted as a standalone process station having a process chamber body 802 for maintaining a low-pressure environment. However, it will be appreciated that a plurality of process stations 800 may be included in a common process tool environment. For example, FIG. 9 depicts an embodiment of a multi-station processing tool. Further, it will be appreciated that, in some embodiments, one or more hardware parameters of process station 800, including those discussed in detail above, may be adjusted programmatically by one or more computer controllers.

Process station 800 fluidly communicates with reactant delivery system 801 for delivering process gases to a distribution showerhead 806. Reactant delivery system 801 includes a mixing vessel 804 for blending and/or conditioning process gases for delivery to showerhead 806. One or more mixing vessel inlet valves 820 may control introduction of process gases to mixing vessel 804.

Some reactants may be stored in liquid form prior to vaporization at and subsequent delivery to the process station. The embodiment of FIG. 8 includes a vaporization point 803 for vaporizing liquid reactant to be supplied to mixing vessel 804. The vaporization point 803 may be the heated injection module shown in FIG. 7, for example. In some embodiments, vaporization point 803 may be a heated vaporizer. The saturated reactant vapor produced from such vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 803 may be heat traced. In some examples, mixing vessel 804 may also be heat traced. In one non-limiting example, piping downstream of vaporization point 803 has an increasing temperature profile extending from approximately 100° C. to approximately 150° C. at mixing vessel 804.

As mentioned, in some embodiments the vaporization point 803 is a heated liquid injector. A liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 806.

In some embodiments, a liquid flow controller upstream of vaporization point 803 may be provided for controlling a mass flow of liquid for vaporization and delivery to process station 800. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 806 distributes process gases toward substrate 812. In the embodiment shown in FIG. 8, substrate 812 is located beneath showerhead 806, and is shown resting on a pedestal 808. It will be appreciated that showerhead 806 may have any suitable shape, and may have any suitable number and arrangement of ports for distributing processes gases to substrate 812.

In some embodiments, a microvolume 807 is located beneath showerhead 806. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 808 may be raised or lowered to expose substrate 812 to microvolume 807 and/or to vary a volume of microvolume 807. For example, in a substrate transfer phase, pedestal 808 may be lowered to allow substrate 812 to be loaded onto pedestal 808. During a deposition on substrate process phase, pedestal 808 may be raised to position substrate 812 within microvolume 807. In some embodiments, microvolume 807 may completely enclose substrate 812 as well as a portion of pedestal 808 to create a region of high flow impedance during a deposition process.

Optionally, pedestal 808 may be lowered and/or raised during portions the deposition process to modulate process pressure, reactant concentration, etc., within microvolume 807. In one scenario where process chamber body 802 remains at a base pressure during the process, lowering pedestal 808 may allow microvolume 807 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 808 may allow a plasma density to be varied during plasma activation and/or treatment cycles included in the deposition process. At the conclusion of the deposition process phase, pedestal 808 may be lowered during another substrate transfer phase to allow removal of substrate 812 from pedestal 808.

While the example microvolume variations described herein refer to a height-adjustable pedestal, it will be appreciated that, in some embodiments, a position of showerhead 806 may be adjusted relative to pedestal 808 to vary a volume of microvolume 807. Further, it will be appreciated that a vertical position of pedestal 808 and/or showerhead 806 may be varied by any suitable mechanism within the scope of the present disclosure. In some embodiments, pedestal 808 may include a rotational axis for rotating an orientation of substrate 812. It will be appreciated that, in some embodiments, one or more of these example adjustments may be performed programmatically by one or more suitable computer controllers.

Returning to the embodiment shown in FIG. 8, showerhead 806 and pedestal 808 electrically communicate with RF power supply 814 and matching network 816 for powering a plasma. In some embodiments, the plasma energy may be controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Examples of suitable powers are included above. Likewise, RF power supply 814 may provide RF power of any suitable frequency. In some embodiments, RF power supply 814 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In certain cases, the controller may have instructions for depositing a conditioning layer on reaction chamber surfaces after a cleaning cycle and/or before deposition on substrates. The controller may also have instructions for depositing secondary pre-coat on chamber surfaces after depositing film on substrates with a first recipe, and before depositing film on substrates with a second recipe. The instructions for depositing a conditioning layer may include any of the process steps described herein. For example, the instructions may include flowing a liquid reagent and helium into a heated injection module at certain flow rates to atomize/vaporize the liquid reagent, and flowing the vaporized stream to the reaction chamber. The controller may also have instructions for providing a purge gas during deposition of a conditioning layer and/or during deposition on substrates, where the purge gas contains helium as described herein.

In some deposition processes, plasma strikes last on the order of a few seconds or more in duration. In certain implementations described herein, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD/CFD cycles.

In some embodiments, pedestal 808 may be temperature controlled via heater 810. Further, in some embodiments, pressure control for process station 800 may be provided by butterfly valve 818. As shown in the embodiment of FIG. 8, butterfly valve 818 throttles a vacuum provided by a downstream vacuum pump (not shown). However, in some embodiments, pressure control of process station 800 may also be adjusted by varying a flow rate of one or more gases introduced to process station 800.

The internal surfaces of the process station 800 are coated with conditioning layer 850, which may include an undercoat and/or a pre-deposition coat. Examples of surfaces that become coated with the conditioning layer include the chamber walls 802, the chamber ceiling and floor, the pedestal 808 and the showerhead 806. Although FIG. 8 is shown with a substrate 812 in the process station 800, this substrate 812 is not present during deposition of the one or more conditioning layers. Instead, the substrate 812 is introduced to the process station 800 after the conditioning layers are deposited, when the process station 800 is ready to be used for depositing film on the substrate 812.

As described above, one or more process stations may be included in a multi-station processing tool. FIG. 9 shows a schematic view of an embodiment of a multi-station processing tool 900 with an inbound load lock 902 and an outbound load lock 904, either or both of which may comprise a remote plasma source. A robot 906, at atmospheric pressure, is configured to move wafers from a cassette loaded through a pod 908 into inbound load lock 902 via an atmospheric port 910. A wafer is placed by the robot 906 on a pedestal 912 in the inbound load lock 902, the atmospheric port 910 is closed, and the load lock is pumped down. Where the inbound load lock 902 comprises a remote plasma source, the wafer may be exposed to a remote plasma treatment in the load lock prior to being introduced into a processing chamber 914. Further, the wafer also may be heated in the inbound load lock 902 as well, for example, to remove moisture and adsorbed gases. Next, a chamber transport port 916 to processing chamber 914 is opened, and another robot (not shown) places the wafer into the reactor on a pedestal of a first station shown in the reactor for processing. While the embodiment depicted in FIG. 9 includes load locks, it will be appreciated that, in some embodiments, direct entry of a wafer into a process station may be provided.

The depicted processing chamber 914 comprises four process stations, numbered from 1 to 4 in the embodiment shown in FIG. 9. Each station has a heated pedestal (shown at 918 for station 1), and gas line inlets. It will be appreciated that in some embodiments, each process station may have different or multiple purposes. For example, in some embodiments, a process station may be switchable between an ALD mode, a CFD mode, and a CVD process mode. Additionally or alternatively, in some embodiments, processing chamber 914 may include one or more matched pairs of ALD/CFD/CVD process stations. While the depicted processing chamber 914 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 also depicts an embodiment of a wafer handling system 990 for transferring wafers within processing chamber 914. In some embodiments, wafer handling system 990 may transfer wafers between various process stations and/or between a process station and a load lock. It will be appreciated that any suitable wafer handling system may be employed. Non-limiting examples include wafer carousels and wafer handling robots. FIG. 9 also depicts an embodiment of a system controller 950 employed to control process conditions and hardware states of process tool 900. System controller 950 may include one or more memory devices 956, one or more mass storage devices 954, and one or more processors 952. Processor 952 may include a CPU or computer, analog and/or digital input/output connections, stepper motor controller boards, etc.

In some embodiments, system controller 950 controls all of the activities of process tool 900. System controller 950 executes system control software 958 stored in mass storage device 954, loaded into memory device 956, and executed on processor 952. System control software 958 may include instructions for controlling the timing, mixture of gaseous and liquid reactants, chamber and/or station pressure, chamber and/or station temperature, wafer temperature, target power levels, RF power levels, RF exposure time, substrate pedestal, chuck and/or susceptor position, and other parameters of a particular process performed by process tool 900. These programmed processes may include various types of processes including, but not limited to, processes related to deposition of an undercoat, processes related to deposition of film on substrates, and processes related to cleaning the chamber. System control software 958 may be configured in any suitable way. For example, various process tool component subroutines or control objects may be written to control operation of the process tool components necessary to carry out various process tool processes. System control software 958 may be coded in any suitable computer readable programming language.

In some embodiments, system control software 958 may include input/output control (IOC) sequencing instructions for controlling the various parameters described above. For example, each phase of a conditioning layer deposition process may include one or more instructions for execution by system controller 950. The instructions for setting process conditions for a conditioning layer deposition process phase may be included in a corresponding conditioning layer deposition recipe phase. In some embodiments, the recipe phases may be sequentially arranged, so that all instructions for a process phase are executed concurrently with that process phase.

Other computer software and/or programs stored on mass storage device 954 and/or memory device 956 associated with system controller 950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 918 and to control the spacing between the substrate and other parts of process tool 900. The positioning program may include instructions for appropriately moving substrates in and out of the reaction chamber as necessary to deposit the conditioning layers, deposit films on substrates, and clean the chamber. These may include instructions for ensuring that no substrates are present in the reaction chamber during deposition of the conditioning layers and during the cleaning process.

A process gas control program may include code for controlling gas composition and flow rates and optionally for flowing gas into one or more process stations prior to deposition in order to stabilize the pressure in the process station. In some embodiments, the process gas control program includes instructions for introducing certain gases during formation of a conditioning layer on the reaction chamber, and for introducing the same or different gases during formation of a film on a substrate in the reaction chamber. The process gas control program may also include instructions to deliver these gases at the same rates, for the same durations, during formation of the conditioning layer and during deposition of film on substrates. The process gas control program may include instructions for atomizing/vaporizing a liquid reactant in the presence of helium in a heated injection module.

A pressure control program may include code for controlling the pressure in the process station by regulating, for example, a throttle valve in the exhaust system of the process station, a gas flow into the process station, etc. The pressure control program may include instructions for maintaining the same pressure during deposition of the conditioning layer on the reaction chamber as during the deposition of film on substrates.

A heater control program may include code for controlling the current to a heating unit that is used to heat the substrate. Alternatively or in addition, the heater control program may control delivery of a heat transfer gas (such as helium) to the substrate. The heater control program may include code for maintaining the same temperature in the reaction chamber and/or substrate holder during deposition of the conditioning layer and during deposition of film on substrates.

A plasma control program may include code for setting RF power levels, frequencies, and exposure times in one or more process stations in accordance with the embodiments herein. In some embodiments, the plasma control program may include instructions for using the same RF power levels and/or frequencies and/or exposure times during deposition of the conditioning layer on the reaction chamber and during deposition of film on substrates.

In some embodiments, there may be a user interface associated with system controller 950. The user interface may include a display screen, graphical software displays of the apparatus and/or process conditions, and user input devices such as pointing devices, keyboards, touch screens, microphones, etc.

In some embodiments, parameters adjusted by system controller 950 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 950 from various process tool sensors. The signals for controlling the process may be output on the analog and digital output connections of process tool 900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 950 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

EXPERIMENTAL

Experimental results show that the inclusion of a high conductivity gas such as helium during formation of the undercoat and in a post-deposition purge can substantially reduce undesired particle formation on substrates.

In one experiment, different substrate deposition recipes (A and B) were practiced in a single deposition chamber under three different scenarios. In the baseline scenario, no helium was provided during formation of the conditioning layer, and no helium was provided during the post-deposition purge period for either process A or process B. In the second scenario (Scheme 2 column), helium was provided during formation of the conditioning layer, but was not provided during the post-deposition purge period for either process A or process B. In the third scenario (Scheme 3 column), helium was provided both during formation of the conditioning layer, and during the post-deposition purge for both process A and process B. The conditioning layer deposited in these experiments was a TEOS-based silicon dioxide deposited to a thickness of about 1 µm. In order to maintain a uniform flow rate of purge gas compared to the other cases, the third scenario used a 50/50 mixture of He and $O_2$, each delivered at 4000 sccm, rather than the 8000 sccm oxygen purge used in the first two scenarios.

Process A was performed at a higher TEOS flow than process B. Further, process A was continued until a film thickness of about 150 Å, while process B was continued until a film thickness of about 100 Å. The processes were run in a mixed recipe mode, such that the reaction chamber periodically switched between process A and process B. In some cases, only a single wafer was processed with each recipe before switching. In other cases, a substantial number of wafers were processed with each recipe before switching. Before a new recipe was run in the reactor, a secondary pre-deposition coat was applied to reaction chamber surfaces to help condition the chamber for the new recipe.

Row 1 in FIG. 10 relates to whether or not helium was used during deposition of the conditioning layer. Rows 2-6 correspond to conditions used during deposition on substrates. Row 2 relates to the purge time and loadlock time. The purge and loadlock periods relate to those described in relation to FIGS. 6A and 6B. Rows 3 and 4 relate to the flows of oxygen and helium during the post-deposition purge, respectively. The post deposition purge corresponds to the purge period of FIGS. 6A and 6B. Row 5 relates to the flow of oxygen during the loadlock time. Row 6 reports the median number of particle adders seen at high accumulation levels (e.g., about 10 µm), for particles having a size of at least 0.04 µm.

As seen in FIG. 10, the baseline process where no helium was used during deposition of the conditioning layer or during the post-deposition purges shows the highest number of particles at a median of 34. By including helium when the conditioning layer is formed, the median number of particles detected falls to 22. Further, when helium is used both during deposition of the conditioning layer, as well as during the post-deposition purges when depositing on substrates, the median number of particles detected falls to 10. From this data, it is clear that helium is beneficial in both of the recited steps. Further, the particle performance is under Scheme 3 is sufficiently good to allow mixed recipe runs on a single tool without significant defect problems.

FIGS. 11-16 present data for an experiment where two PECVD recipes were used to deposit silicon oxide film on substrates. The two different recipes are referred to as process A and process B. The recipes were run in both single recipe mode and mixed recipe mode. In other words, sometimes a single recipe was used to deposit on many substrates in a row (single recipe mode), while at other times the recipes were changed more frequently (mixed recipe mode). Film was deposited on a total of about 8,500 substrates. A second pre-deposition coat was deposited on reaction chamber surfaces before each time a new recipe was used to deposit film on substrates. The data was collected using first wafer, middle wafer, and unload wafers for each recipe run, as available. Particles of about 0.04 µm and larger were detected on the substrates. The wafers processed early in each recipe run (i.e., the first wafers, or single wafers where only a single substrate was processed before switching recipes) show the highest levels of particle formation. The middle and unload wafers that were processed at later times in the recipe runs show lower, steady state levels of particle formation.

Figures 11, 12:
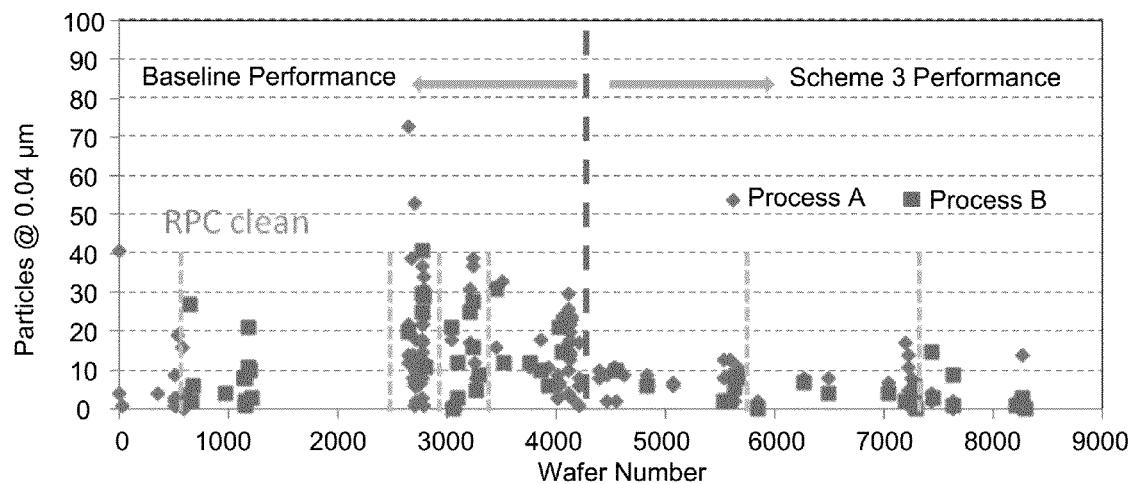
FIG. 11 is a graph showing the number of particles detected on substrates under two different processing schemes.
FIG. 12 is a table summarizing the data shown in FIG. 11.

The data in the left portion of the graph in FIG. 11 relates to a baseline method where processes A and B were run in a chamber having an undercoat that was formed without helium, and where processes A and B did not include helium in the post-deposition purges. The data in the right portion of the graph relates to an improved method where processes A and B were run in a chamber having an undercoat that was formed with helium, and where processes A and B included helium in the post-deposition purges. The conditions used in the improved method are the same as those used with Scheme 3 of FIG. 10. The x-axis in FIG. 11 relates to the number of the wafer being processed (the first wafer processed being wafer 1), and the y-axis relates to the number of particles detected on that substrate after deposition. The dotted vertical lines extending partially upward in FIG. 11 (and FIGS. 14 and 15) represent instances where a remote plasma clean was performed. The remote plasma clean removes deposited material from the chamber surfaces, as described above. A fresh conditioning layer was deposited after each remote plasma clean.

Notably, the improved method using helium results in many fewer particles deposited on the substrates, as shown in FIG. 11. The improved method does not result in any substrates having high levels of defects. All of the substrates processed with the improved helium method have fewer than 20 particles detected. In contrast, the baseline method shows a much higher level of particle formation overall, and there are several substrates that show very high levels of particle formation (e.g., about 70 particles).

FIG. 12 shows a table relating the maximum and medium number of particles detected on substrates at 0.04 µm and 0.08 µm for processes A and B during the 8,500 substrate experiment described in relation to FIG. 11. The improved Scheme 3 process results in a lower maximum and median number of particles detected on the substrates, as compared to the baseline process. This is true for both deposition recipes, process A and process B, and for both particle sizes, 0.04 µm and 0.08 µm.

Figure 13:
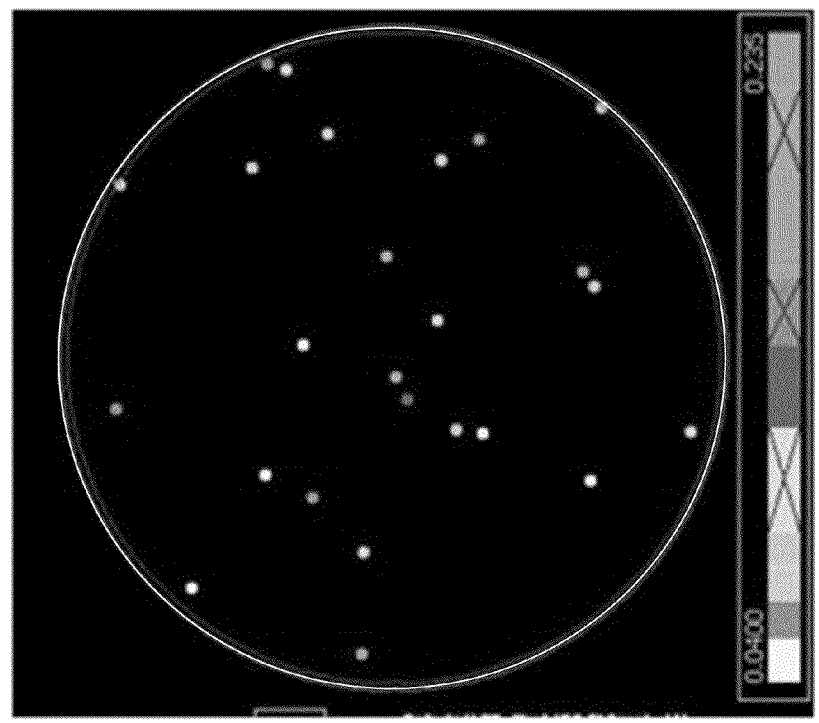
FIG. 13 shows representative defect maps for substrates processed under two different processing schemes.
Figure 13:
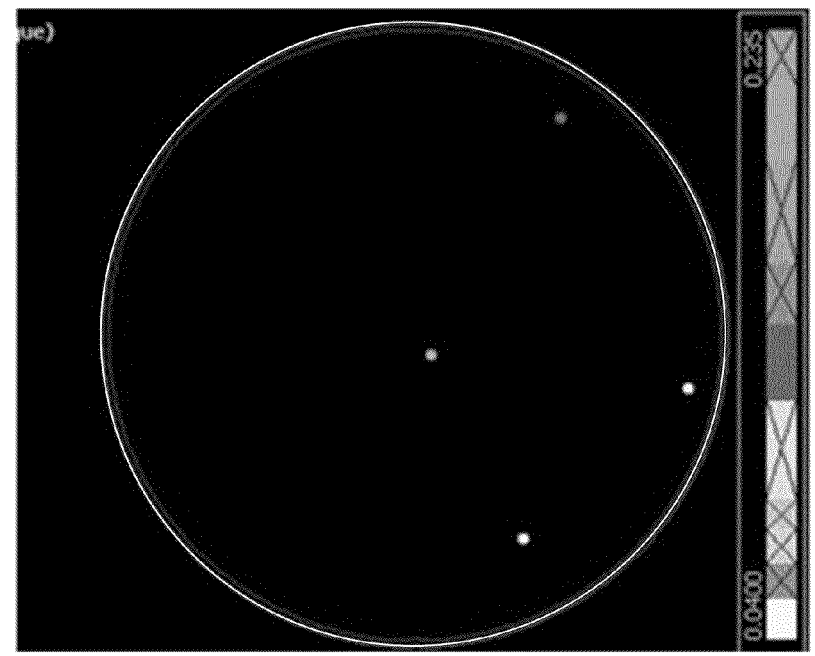

FIG. 13 illustrates representative defect maps at 0.04 µm for a substrate processed under the baseline scheme (top panel), and for a substrate processed under the improved Scheme 3 (bottom panel), where helium was used during deposition of the conditioning layer and during the post-deposition purge. The substrate processed with helium showed substantially fewer defects.

Figure 14:
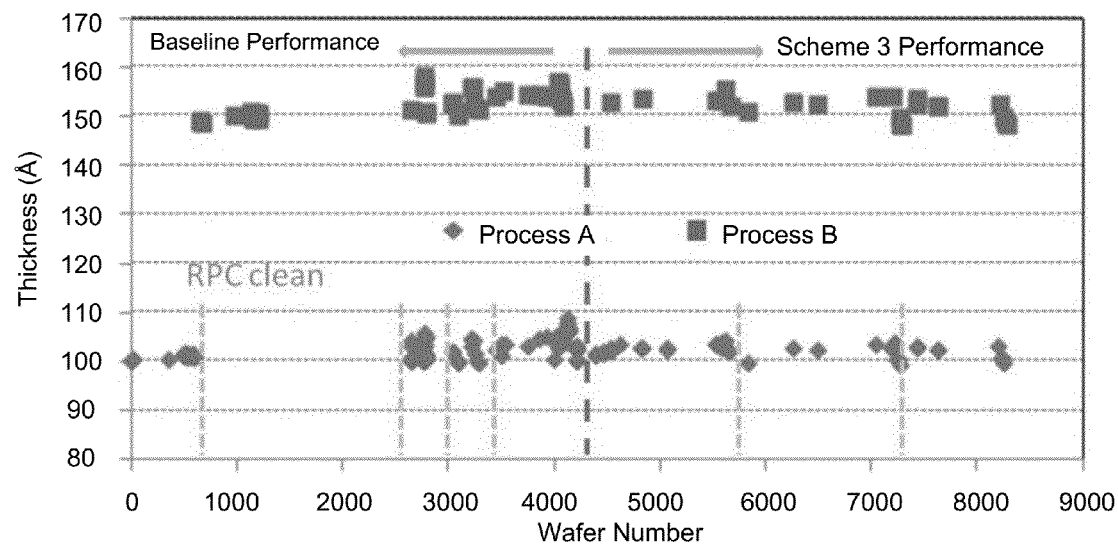
FIG. 14 is a graph showing the film thickness for films deposited under two different processing schemes.

FIG. 14 shows the thickness of film deposited on substrates during the 8,500 substrate run described above in relation to FIGS. 11-13. As noted, process A was run to a target thickness of about 100 Å, and process B was run to a target thickness of about 150 Å. Similar to FIG. 11, the data in the left portion of the graph corresponds to the baseline process, while the data in the right portion of the graph corresponds to the improved helium method using the Scheme 3 conditions. The thickness performance was largely unchanged between the baseline method and the improved Scheme 3 method.

Figure 15:
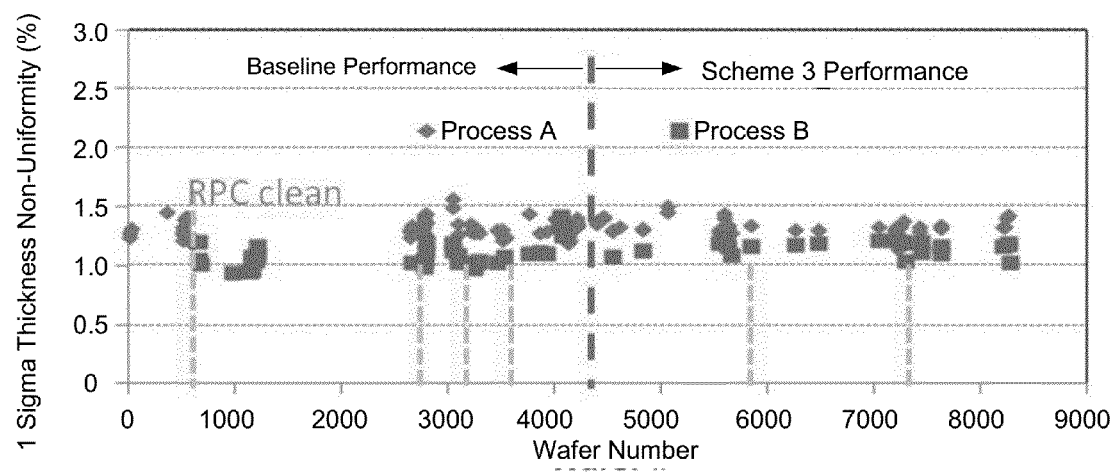
FIG. 15 is a graph showing the film thickness non-uniformity for films deposited under two different processing schemes.

FIG. 15 shows the 1σ within-wafer thickness non-uniformity for the substrates processed during the 8,500 substrate run described in relation to FIGS. 11-14. The thickness non-uniformity was comparable between the baseline process and the Scheme 3 process using helium.

Figures 16, 17:
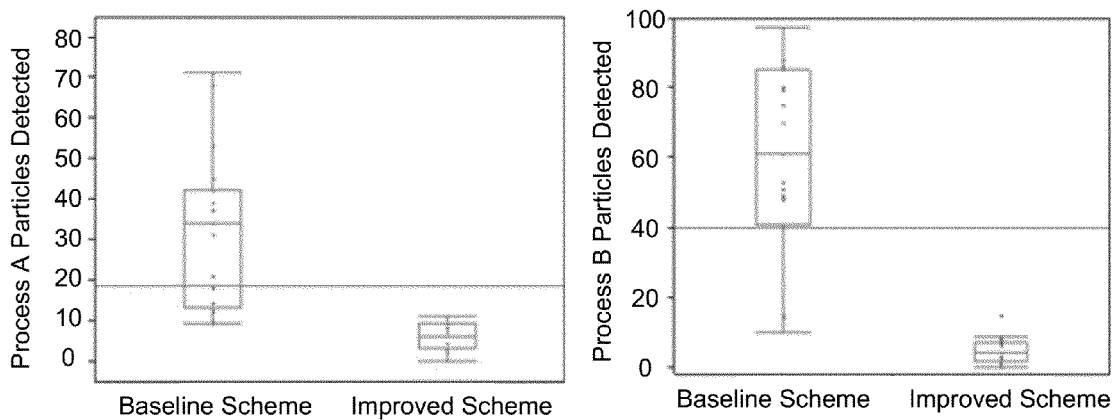
FIG. 16 is a table summarizing the data shown in FIGS. 14 and 15.
FIG. 17 is a plot showing the number of particles observed on substrates that were processed under two different schemes.

FIG. 16 is a table summarizing the thickness and thickness non-uniformity results shown in FIGS. 14 and 15. Both the thickness and the thickness non-uniformity were comparable between the baseline process and the improved Scheme 3 process that used helium.

FIG. 17 presents a box and whisker plot related to the number of particles detected on substrates processed under two schemes. Only particles of 0.04 μm and larger were detected. In the Baseline Scheme, no helium was used during deposition of the conditioning layers, and no helium was used as part of the post-deposition purge gas. In the Improved Scheme, helium was used during formation of the conditioning layers as well as during the post-deposition purges. The process conditions for the Improved Scheme are the same as those described in relation to Scheme 3 of FIGS. 10-16. Two different deposition recipes were used including process A and process B. The data was collected using a mixed recipe mode. In other words, the recipes were frequently switched in the reaction chamber, and the data was collected on substrates that were processed immediately or soon after the recipe switch. Each time a recipe was switched, a new conditioning layer (a secondary pre-deposition coat) was deposited on surfaces of the reaction chamber, as occurred with the other experiments described herein. The Improved Scheme shows substantially fewer particles detected on the substrate surface for both process A and process B.

Overall, the experimental results show that the inclusion of helium in the processing gas used to vaporize TEOS during formation of a chamber conditioning layer reduces the number of particles detected on substrates processed in the chamber. The results also show that the inclusion of helium in the purge gas further reduces the number of particles detected on the substrates processed in the chamber. These modifications can be done without substantially affecting the thickness and thickness non-uniformity of the deposited films.

What is claimed is:

1. A method for preparing a reaction chamber for depositing film on substrates, comprising:
    flowing a liquid reagent into a heated injection module;
    atomizing the liquid reagent in the heated injection module in the presence of helium to create a source gas comprising the atomized liquid reagent and helium;
    flowing the source gas from the heated injection module into the reaction chamber; and
    exposing the reaction chamber to plasma to deposit a film from the source gas on surfaces of the reaction chamber while no substrate is present in the reaction chamber.

2. The method of claim 1, wherein the liquid reagent is TEOS, and wherein the TEOS is flowed at a rate less than about 10 mL/min into the heated injection module.

3. The method of claim 2, wherein the source gas further comprises oxygen.

4. The method of claim 2, wherein flowing the source gas into the reaction chamber and exposing the reaction chamber to plasma are performed at least partially concurrently to thereby deposit the film through a chemical vapor deposition gas-phase reaction.

5. The method of claim 1, wherein the source gas comprises between about 40-80% helium, by volume.

6. The method of claim 1, wherein flowing the source gas into the reaction chamber and exposing the reaction chamber to plasma are performed cyclically to deposit the film through an atomic layer deposition surface reaction.

7. The method of claim 1, wherein the reaction chamber is exposed to plasma for a duration between about 30-90 seconds to form an undercoat film.

8. The method of claim 7, further comprising repeating the method to form a pre-deposition coat film on the undercoat film, wherein during formation of the pre-deposition coat film, the reaction chamber is exposed to plasma for a duration between about 60-350 seconds, and wherein a deposition rate on surfaces of the reaction chamber is higher during formation of the undercoat film than during formation of the pre-deposition coat film.

9. The method of claim 1, wherein a first iteration of the method results in formation of an undercoat film, and further comprising repeating the method a second iteration to form a pre-deposition coat film, wherein a deposition rate on surfaces of the reaction chamber is higher during formation of the undercoat film than during formation of the pre-deposition coat film.

10. A method for depositing film on a substrate, comprising:
    flowing a first source gas comprising a first reagent and helium into a reaction chamber and exposing the reaction chamber to a first plasma to thereby deposit a first film on surfaces of the reaction chamber while no substrate is present in the reaction chamber, wherein the first reagent is liquid at room temperature, and wherein the first reagent is atomized in the presence of the helium before flowing into the reaction chamber;
    providing the substrate to the reaction chamber;
    flowing a second source gas into the reaction chamber and exposing the reaction chamber to a second plasma to thereby deposit a second film on the substrate, wherein the second source gas comprises a second reagent that is liquid at room temperature, and wherein the second source gas is substantially free of helium.

11. The method of claim 10, wherein the first reagent comprises TEOS.

12. The method of claim 11, wherein the flow rate of TEOS in the first source gas flowed into the reaction chamber is less than about 10 mL/min, as measured when the TEOS is in liquid form at room temperature.

13. The method of claim 10, further comprising purging the reaction chamber for at least about 3 seconds with a purge gas comprising helium after the second film, or a portion thereof, is formed on the substrate.

14. The method of claim 13, wherein the helium in the purge gas flows at a rate between about 10-20 SLM.

15. The method of claim 10, wherein the second reagent comprises TEOS.

16. The method of claim 10, further comprising before providing the substrate to the reaction chamber, flowing a third source gas comprising a third reagent and helium into the reaction chamber and exposing the reaction chamber to a third plasma to thereby deposit a third film on surfaces of the reaction chamber while no substrate is present in the reaction chamber, wherein the third reagent is liquid at room temperature, wherein the first plasma is exposed to the reaction chamber for a duration between about 30-90 seconds, wherein the third plasma is exposed to the reaction chamber for a duration between about 60-350 seconds, and wherein a deposition rate is higher during deposition of the first film than during deposition of the third film.

17. The method of claim 10 further comprising:
    after depositing the second film on the substrate, removing the substrate from the reaction chamber;
    flowing a fourth source gas into the reaction chamber and exposing the reaction chamber to a fourth plasma to thereby deposit a fourth film on surfaces of the reaction chamber, wherein the fourth source gas comprises helium;

receiving a second substrate in the reaction chamber; and flowing a fifth source gas into the reaction chamber and exposing the reaction chamber to a fifth plasma to thereby deposit a fifth film on the second substrate, wherein at least one reaction parameter is different between depositing the second film on the substrate and depositing the fifth film on the second substrate, wherein the reaction parameter is selected from the group consisting of: a power used to generate plasma, a frequency used to generate plasma, plasma exposure time, reactants delivered to the reaction chamber, timing of delivery of reactants to the reaction chamber, flow rate of delivery of reactants to the reaction chamber, pressure, electrode gap and temperature.

18. The method of claim 17, wherein the fourth film is deposited on surfaces of the reaction chamber without first cleaning the surfaces of the reaction chamber after the second film is deposited on the substrate.

19. The method of claim 18, wherein the second film deposited on the substrate and the fifth film deposited on the second substrate have fewer than about 10 particles of about 0.04 μm or larger detectable thereon.

20. The method of claim 18, wherein the fifth film is deposited on the substrate immediately after the fourth film is formed on surfaces of the reaction chamber, without any intervening deposition operations in the reaction chamber, and wherein the fifth film has fewer than about 20 particles of about 0.04 μm or larger detectable thereon.

21. The method of claim 10, further comprising before providing the substrate to the reaction chamber, flowing a third source gas comprising a third reagent and helium into the reaction chamber and exposing the reaction chamber to a third plasma to thereby deposit a third film on surfaces of the reaction chamber while no substrate is present in the reaction chamber, wherein the third reagent is liquid at room temperature, wherein a deposition rate is higher during deposition of the first film than during deposition of the third film.

22. The method of claim 10, wherein the second film deposited on the substrate has fewer than about 10 particles of about 0.04 μm or larger detectable thereon.

\* \* \* \* \*